United States Patent
Jaiprakash et al.

(10) Patent No.: US 7,719,067 B2
(45) Date of Patent: *May 18, 2010

(54) DEVICES HAVING VERTICALLY-DISPOSED NANOFABRIC ARTICLES AND METHODS OF MAKING THE SAME

(75) Inventors: Venkatachalam C. Jaiprakash, Fremont, CA (US); Jonathan W. Ward, Fairfax, VA (US); Thomas Rueckes, Rockport, MA (US); Brent M. Segal, Woburn, MA (US)

(73) Assignee: Nantero, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/526,364

(22) Filed: Sep. 25, 2006

(65) Prior Publication Data

US 2010/0012927 A1 Jan. 21, 2010

Related U.S. Application Data

(60) Division of application No. 11/158,544, filed on Jun. 22, 2005, now Pat. No. 7,274,078, which is a continuation of application No. 10/776,572, filed on Feb. 11, 2004, now Pat. No. 6,924,538, which is a continuation-in-part of application No. 10/341,005, filed on Jan. 13, 2003, which is a continuation-in-part of application No. 10/128,118, filed on Apr. 23, 2002, which is a continuation-in-part of application No. 09/915,093, filed on Jul. 25, 2001, now Pat. No. 6,919,592, which is a continuation-in-part of application No. 09/915,095, filed on Jul. 25, 2001, which is a continuation-in-part of application No. 09/915,173, filed on Jul. 25, 2001, which is a continuation-in-part of application No. 10/033,323, filed on Dec. 28, 2001.

(60) Provisional application No. 60/446,783, filed on Feb. 12, 2003, provisional application No. 60/446,786, filed on Feb. 12, 2003.

(51) Int. Cl.
*H01L 27/14* (2006.01)

(52) U.S. Cl. .............. 257/414; 257/415; 257/E21.582; 977/943

(58) Field of Classification Search ............. 257/414, 257/415, 429, 428, E21.582; 977/700, 742, 977/743, 752, 783, 784, 750, 902, 943
See application file for complete search history.

(56) References Cited

U.S. PATENT DOCUMENTS 4,979,149 A 12/1990 Popovic et al.
(Continued)

FOREIGN PATENT DOCUMENTS

GB 2364933 2/2002
(Continued)

OTHER PUBLICATIONS

Ago, Hiroki et al. "Gas-Phase Synthesis of Single-wall Carbon Nanotubes from Colloidal Solution of Metal Nanoparticles." Journal of Physical Chemistry B (Nov. 1,2001); 105, 10453-10456.
(Continued)

*Primary Examiner*—Brook Kebede
(74) *Attorney, Agent, or Firm*—Wilmer Cutler Pickering Hale and Dorr LLP

(57) ABSTRACT

Electro-mechanical switches and memory cells using vertically-oriented nanofabric articles and methods of making the same. Under one aspect, a nanotube device includes a substantially horizontal substrate having a vertically oriented feature; and a nanotube film substantially conforming to a horizontal feature of the substrate and also to at least the vertically oriented feature. Under another aspect, an electromechanical device includes a structure having a major horizontal surface and a channel formed therein, the channel having first and second wall electrodes defining at least a portion of first and second vertical walls of the channel; first and second nanotube articles vertically suspended in the channel and in spaced relation to a corresponding first and second wall electrode, and electromechanically deflectable in a horizontal direction toward or away from the corresponding first and second wall electrode in response to electrical stimulation.

25 Claims, 19 Drawing Sheets

U.S. PATENT DOCUMENTS

| | | | |
|---|---|---|---|
| 5,973,444 A * | 10/1999 | Xu et al. | 313/309 |
| 6,057,637 A | 5/2000 | Zettl et al. | |
| 6,100,109 A | 8/2000 | Melzner et al. | |
| 6,128,214 A | 10/2000 | Kuekes et al. | |
| 6,250,984 B1 | 6/2001 | Jin et al. | |
| 6,256,767 B1 | 7/2001 | Kuekes et al. | |
| 6,277,318 B1 | 8/2001 | Bower et al. | |
| 6,314,019 B1 | 11/2001 | Kuekes et al. | |
| 6,342,276 B1 | 1/2002 | You | |
| 6,409,567 B1 | 6/2002 | Amey et al. | |
| 6,423,583 B1 * | 7/2002 | Avouris et al. | 438/132 |
| 6,426,687 B1 | 7/2002 | Osborn | |
| 6,440,761 B1 * | 8/2002 | Choi | 438/20 |
| 6,443,901 B1 | 9/2002 | Fraser | |
| 6,445,006 B1 | 9/2002 | Brandes et al. | |
| 6,495,116 B1 | 12/2002 | Herman | |
| 6,495,258 B1 | 12/2002 | Chen et al. | |
| 6,515,339 B2 | 2/2003 | Shin et al. | |
| 6,528,020 B1 | 3/2003 | Dai et al. | |
| 6,548,841 B2 | 4/2003 | Frazier et al. | |
| 6,630,772 B1 | 10/2003 | Bower et al. | |
| 6,642,639 B2 * | 11/2003 | Choi et al. | 313/309 |
| 6,645,628 B2 | 11/2003 | Shiffler, Jr. et al. | |
| 6,706,402 B2 | 3/2004 | Rueckes et al. | |
| 6,707,098 B2 | 3/2004 | Hofmann et al. | |
| 6,803,840 B2 | 10/2004 | Hunt et al. | |
| 6,808,746 B1 | 10/2004 | Dai et al. | |
| 6,809,462 B2 | 10/2004 | Pelrine et al. | |
| 6,833,558 B2 | 12/2004 | Lee et al. | |
| 6,858,197 B1 | 2/2005 | Delzeit | |
| 6,863,942 B2 | 3/2005 | Ren et al. | |
| 6,899,945 B2 | 5/2005 | Smalley et al. | |
| 6,918,284 B2 | 7/2005 | Snow et al. | |
| 6,919,592 B2 | 7/2005 | Segal et al. | |
| 6,919,740 B2 | 7/2005 | Snider | |
| 6,921,575 B2 | 7/2005 | Horiuchi et al. | |
| 6,924,538 B2 * | 8/2005 | Jaiprakash et al. | 257/415 |
| 6,946,410 B2 | 9/2005 | French et al. | |
| 6,955,937 B1 | 10/2005 | Burke et al. | |
| 6,969,651 B1 | 11/2005 | Lu et al. | |
| 7,057,402 B2 | 6/2006 | Cole et al. | |
| 7,274,078 B2 * | 9/2007 | Jaiprakash et al. | 257/414 |
| 2001/0004979 A1 | 6/2001 | Han et al. | |
| 2002/0160111 A1 | 10/2002 | Sun et al. | |
| 2003/0004058 A1 | 1/2003 | Li et al. | |
| 2003/0021966 A1 | 1/2003 | Segal et al. | |
| 2003/0122111 A1 | 7/2003 | Glatkowski | |
| 2003/0177450 A1 | 9/2003 | Nugent | |
| 2003/0200521 A1 | 10/2003 | DeHon et al. | |
| 2004/0005723 A1 | 1/2004 | Empedocles et al. | |
| 2004/0007528 A1 | 1/2004 | Bakajin et al. | |
| 2004/0023253 A1 | 2/2004 | Kunwar et al. | |
| 2004/0041154 A1 | 3/2004 | Watanabe et al. | |
| 2004/0043527 A1 | 3/2004 | Bradley et al. | |
| 2004/0071949 A1 | 4/2004 | Glatkowski et al. | |
| 2004/0099438 A1 | 5/2004 | Arthur et al. | |
| 2004/0104129 A1 | 6/2004 | Gu et al. | |
| 2004/0181630 A1 | 9/2004 | Jaiprakash et al. | |
| 2004/0238907 A1 | 12/2004 | Pinkerton et al. | |
| 2004/0253167 A1 | 12/2004 | Silva et al. | |
| 2004/0265550 A1 | 12/2004 | Glatkowski et al. | |
| 2005/0053525 A1 | 3/2005 | Segal et al. | |
| 2005/0065741 A1 | 3/2005 | Segal et al. | |
| 2005/0068128 A1 | 3/2005 | Yip | |
| 2005/0095938 A1 | 5/2005 | Rosenberger et al. | |
| 2006/0237537 A1 | 10/2006 | Empedocles | |
| 2006/0237799 A1 | 10/2006 | Lu et al. | |
| 2006/0278902 A1 | 12/2006 | Sun et al. | |
| 2007/0004191 A1 | 1/2007 | Gu et al. | |

FOREIGN PATENT DOCUMENTS

| | | |
|---|---|---|
| JP | 2000203821 | 7/2000 |
| JP | 2001-035362 | 2/2001 |
| JP | 2004-090208 | 3/2004 |
| WO | WO-98/39250 | 9/1998 |
| WO | WO-99/65821 | 12/1999 |
| WO | WO-00/48195 | 8/2000 |
| WO | WO-01/03208 A1 | 1/2001 |
| WO | WO-01/61753 | 8/2001 |
| WO | WO-02/45113 | 6/2002 |
| WO | WO-02/48701 | 6/2002 |
| WO | WO-03/016901 | 2/2003 |
| WO | WO-03/034142 A1 | 4/2003 |

OTHER PUBLICATIONS

Benerjee, Sarbajit and Stanislaus S. Wong. "Functionalization of Carbon Nanotubes with a Metal-Containing Molecular Complex." Nano Letters 2001 ; 0, A-E.

Chiang I.W., "Purification and Characterization of Single-Wall Carbon Nanotubes (SWNTs) Obtained from the Gas-Phase Decomposition of CO (HiPco Process)," J. Phys. Chem. B 2001, vol. 105, pp. 8297-8301.

Delzeit, L., et al., "Multilayered Metal Catalysts for Controlling the Density of Single-walled Carbon Nanotube Growth." Chemical Physics Letters, 348, 368, 2001.

Haddon, R. C. "C70 Thin Film Transistors," Journal of the American Chemical Society (1996); 118, 3041-3042.

Jeong, Tak, et al., "A new purification method of single-wall carbon nanotubes using H2S and O2 mixture gas" Chemical Physics Letters (2001) 344: 18-22.

Kahn, Michael G. C., et al., "Solubilization of Oxidized Single-Walled Carbon Nanotubes in Organic and Aqueous Solvents through Organic Derivation" (2002) 2(11) 1215-1218.

Shelimov, Konstantin B., et al., "Purification of single-wall carbon nanotubes by ultrasonically assisted filtration" Chemical Physics Letters (1998) 282: 429-434.

International Search Report and Written Opinion for International Application No. PCT/US05/18467, May 26, 2005, 5 pages.

International Search Report and Written Opinion for International Application No. PCT/U505/18539, Sep. 18, 2006, 4 pages.

International Search Report for International Application No. PCT/US05/45316, Sep. 6, 2006, 2 pages.

U.S. Appl. No. 10/341,005, filed Jan. 13, 2003, Ward.

Ajayan, P.I M.et al., "Applications of Carbon Nanotubes." Topics in Applied Physics, vol. 80, pp. 391-425, 2001.

Avouris, Ph., "Carbon nanotube electronics", *Chem. Physics*, 2002, vol. 281, pp. 429-445.

Berhan, L. et al., "Mechanical properties of nanotube sheets: Alterations in joint morphology and achievable moduli in manufacturable materials", Journal of Applied Physics, vol. 95, No. 8, pp. 4335-4345, Apr. 15, 2004.

Bonard, J. et al., "Monodisperse Multiwall Carbon Nanotubes Obtained with Ferritin as Catalyst," Nano Letters, 2002, vol. 2, No. 6, 665-667.

Bradley, K. et al., "Flexible Nanotube Electronics," *Nano Letters*, vol. 3, No. 10, pp. 1353-1355, 2003.

Cassell, Alan M. et al. "Large Scale CVD Synthesis of Single-Walled Carbon Nanotubes." American Chemical Society, pp. 6484-6492, 1999.

Chen, B., et al., "Heterogeneous Single-Walled Carbon Nanotube Catalyst Discovery and Optimization." Chem. Mater., vol. 14, pp. 1891-1896, 2002.

Cheng, H. M. et al. "Large-scale and low-cost synthesis of single-walled carbon nanotubes by the catalyst pyrolysis of hydrocarbons", Applied Physics Letters, vol. 72, pp. 3282-3284, Jun. 22, 1998.

Dai, H. et al, "Controlled Chemical Routes to Nanotube Architectures, Physics and Devices," J. Phys. Chem. *B*, Dec. 7, 1999, vol. 103, pp. 111246-111255.

Dequesnes, M. et al, "Calculation of pull-in voltages for cabon-nanotube-based nanoelectromechanical switches," *Nanotechnology*, 2002, vol. 13, pp. 120-131.

Desai et al., "Freestanding Carbon Nanotube Specific Fabrication," Proc. of 2005 5th IEEE Conf., Nanotech., Nagoya, Japan, pp. 1-4, Jul. 2005.

Franklin, N. R. et al, "An Enhanced CVD Approach to Extensive Nanotube Networks with Directionality", Advanced Materials, pp. 890-894, 2002.

Hafner, Jason H. et al. "Catalytic growth of single-wall carbon nanotubes from metal particles," Chemical Physics Letters, vol. 296, pp. 195-202, Oct. 30, 1998.

Homma, Y., "Single-Walled Carbon Nanotube Growth on Silicon Substrates Using Nanoparticle Catalysts", Jpn. J. Appl. Phys., vol. 41, pp. L89-L91, 2002.

Joselevich, Ernesto, "Vectorial Growth of Metallic and Semiconducting Single-Wall Carbon Nanotubes," Nano Letters, xxxx, vol. 0, pp. A-E.

Kaneto, K., et al., "Electrical conductivities of multi-wall carbon nano tubes", Synthetic Metals, Elsevier Science S.A., vol. 103, pp. 2543-2546, 1999.

Kong, J. et al., "Nanotube Molecular Wires as Chemical Sensors", Science, VOl. 287, pp. 622-625, Jan. 28, 2000.

Kong, Jing, "Chemical vapor deposition of methane for single-walled carbon nanotubes," Chemical Physics Letters, vol. 292, pp. 567-574,1998.

Li, J. et al., "Carbon Nanotube Nanoelectrode Array for Ultrasensitive DNA Detection", Nano Letters, vol. 3, No. 5, pp. 597-602, 2003.

Li, Y. et al., "Preparation of Monodispersed Fe-Mo Nanoparticles as the Catalyst for CVD Synthesis of Carbon Nanotubes", Chem. Mater., vol. 12, p. 1008, 2001.

Li, Y., et al., "Growth of Single-Walled Carbon Nanotubes from Discrete Catalytic Nanoparticles of Various Sizes", The Journal of Physical Chemistry B, vol. 105, p. 11424, 2001.

Nerushev, O. A. et al. "Carbon nanotube films obtained by thermal chemical vapor deposition", Journal of Chemistry Materials, vol. 11, pp. 1122-1132, 2001.

Onoa, G.B. et al., "Bulk production of singly dispersed carbon nanotubes with prescribed lengths," Nanotechnology, vol. 16, pp. 2799-2803, 2005.

Parikh, K. et al., "Flexible vapour sensors using single walled carbon nanotubes", Sensors and Actuators B, vol. 113, pp. 55-63, 2006.

Peigney, A. et al. "A Study of the Formation of Single- and Double-Walled Carbon Nanotubes by a CVD Method", Journal of Physical Chemistry B, vol. 105, pp. 9699-9710, 2001.

Qi, P. et al., "Toward Large Arrays of Multiplex Functionalized Carbon Nanotube Sensors for Highly Sensitive and Selective Molecular Detection", Nano Letters, vol. 3, No. 3, pp. 347-351, 2003.

Sotiropoulou, S. et al., "Carbon nanotube array-based biosensor", Anal Bioanal Chem, vol. 375, pp. 103-105, 2003.

Stadermann, M. et al., "Nanoscale study of conduction through carbon nanotube networks," Phys. Rev. B 69, 201402(R), 2004.

Valentini, L. et al., "Sensors for sub-ppm NO2 gas detection based on carbon nanotube thin films", Applied Physics Letters, vol. 82, No. 6, pp. 961-963, Feb. 10, 2003.

Zhang, S. et al., "Select Pathways to Carbon Nanotube Film Growth", Advanced Materials, vol. 13, pp. 1767-1770, Dec. 3, 2001.

Zhang, Y. et al., "Formation of metal nanowires on suspended single-walled carbon nanotubes", Applied Physics Letters, vol. 77, pp. 3015-3017, Nov. 6, 2000.

Zhang, Y. et al., "Metal coating on suspended carbon nanotubes and its implication to metal-tube interaction", Chemical Physics Letters pp. 35-41, Nov. 24, 2000.

Zhao, Y. P. et al., "Frequency-dependent electrical transport in carbon nanotubes", Physical Review B, vol. 64, 201402(4), 2001.

Niu, C. et al., "High power electrochemical capacitors based on carbon nanotube electrodes," Appl. Phys. Lett. 70 (11), Mar. 17, 1997, pp. 1480-1482.

\* cited by examiner

DEVICES HAVING VERTICALLY-DISPOSED NANOFABRIC ARTICLES AND METHODS OF MAKING THE SAME

CROSS-REFERENCE TO RELATED APPLICATIONS

This application is a divisional application of and claims priority under 35 U.S.C. §121 to U.S. patent application Ser. No. 11/158,544, filed on Jun. 22, 2005 and entitled Devices Having Vertically-Disposed Nanofabric Articles and Methods of Making the Same, which is a continuation of and claims priority under 35 U.S.C. §120 to U.S. patent application Ser. No. 10/776,572, filed on Feb. 11, 2004 and entitled Devices Having Vertically-Disposed Nanofabric Articles and Methods of Making the Same, which claims priority under 35 U.S.C. §119(e) to U.S. Provisional Patent Application Ser. No. 60/446,786, filed on Feb. 12, 2003 and entitled Electro-Mechanical Switches and Memory Cells Using Vertically-Disposed Nanofabric Articles and Methods of Making the Same and to U.S. Patent Application Ser. No. 60/446,783, filed on Feb. 12, 2003 and entitled Electro-Mechanical Switches and Memory Cells Using Horizontally-Disposed Nanofabric Articles and Methods of Making the Same, the entire contents of which are incorporated herein by reference, and which is a continuation-in-part of and claims priority under 35 U.S.C. §120 to the following applications which are expressly incorporated herein by reference in their entireties:

U.S. patent application Ser. No. 09/915,093, filed on Jul. 25, 2001 and entitled Electromechanical Memory Array Using Nanotube Ribbons and Method for Making Same;

U.S. patent application Ser. No. 10/033,323, filed on Dec. 28, 2001 and entitled Electromechanical Three-Trace Junction Devices;

U.S. patent application Ser. No. 10/128,118, filed Apr. 23, 2002 and entitled Nanotube Films and Articles; and U.S. patent application Ser. No. 10/341,005, filed on Jan. 13, 2003 and entitled Methods of Making Carbon Nanotube Films, Layers, Fabrics, Ribbons, Elements and Articles.

TECHNICAL FIELD

The present application relates to devices having vertically-disposed and other non-horizontally disposed nanofabric articles and to methods of making the same.

BACKGROUND

Memory devices have been proposed which use nanoscopic wires, such as single-walled carbon nanotubes, to form crossbar junctions to serve as memory cells. (See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94-97, 7 Jul. 2000.) Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

The NTWCM proposals rely on directed growth or chemical self-assembly techniques to grow the individual nanotubes needed for the memory cells. These techniques are now believed to be difficult to employ at commercial scales using modern technology. Moreover, they may contain inherent limitations such as the length of the nanotubes that may be grown reliably using these techniques, and it may difficult to control the statistical variance of geometries of nanotube wires so grown. Improved memory cell designs are thus desired.

U.S. Patent Publication No. 2003-0021966 discloses, among other things, electromechanical circuits, such as memory cells, in which circuits include a structure having electrically conductive traces and supports extending from a surface of a substrate. Nanotube ribbons are suspended by the supports that cross the electrically conductive traces. Each ribbon comprises one or more nanotubes. The ribbons are formed from selectively removing material from a layer or matted fabric of nanotubes.

For example, as disclosed in U.S. Patent Application Publication No. 2003-0021966, a nanofabric may be patterned into ribbons, and the ribbons can be used as a component to create non-volatile electromechanical memory cells. The ribbon is electromechanically-deflectable in response to electrical stimulus of control traces and/or the ribbon. The deflected, physical state of the ribbon may be made to represent a corresponding information state. The deflected, physical state has non-volatile properties, meaning the ribbon retains its physical (and therefore informational) state even if power to the memory cell is removed. As explained in U.S. Patent Application Publication No. 2003-0124325, three-trace architectures may be used for electromechanical memory cells, in which the two of the traces are electrodes to control the deflection of the ribbon.

SUMMARY

The present invention provides new devices having vertically-disposed nanofabric articles and methods of making same.

Under certain aspects of the invention, an electromechanical device, includes a structure having a major horizontal surface and a channel formed therein. A conductive trace is in the channel; and a nanotube article vertically suspended in the channel, in spaced relation to a vertical wall of the channel. The article is electro-mechanically deflectable in a horizontal direction toward the conductive trace.

Under another aspect of the invention, the vertically suspended extent of the nanotube article is defined by a thin film process.

Under another aspect of the invention, the vertically suspended extent of the nanotube article is about 50 nanometers or less.

Under another aspect of the invention, the nanotube article is clamped with a conducting material disposed in porous spaces between some nanotubes of the nanotube article.

Under another aspect of the invention, the nanotube article is formed from a porous nanofabric.

Under another aspect of the invention, the nanotube article is electromechanically deflectable into contact with the conductive trace and the contact is either a volatile state or non-volatile state depending on the device construction.

Under other aspects of the invention, the vertically oriented device is arranged into various forms of three-trace devices.

Under yet other aspects of the invention, the channel may be used for multiple independent devices, or for devices that share a common electrode.

DETAILED DESCRIPTION

Preferred embodiments of the invention provide new articles having non-horizontally-disposed nanotube articles and provide methods of making same. Some embodiments provide improved ways of clamping or pinching suspended nanotube articles to improve their performance and manufacturability. Other embodiments provide electromechanical memory cells, which may be discrete or embedded. Under some embodiments, the discrete memory cells use new approaches to connect to other circuitry or cells, which lowers the resistivity of traces to the memory cells. Still other embodiments provide memory cells that have volatile information state (i.e., the information state is lost when power is interrupted). Some other embodiments use three-trace architectures analogous to those of U.S. Patent Application Publication No. 2003-0124325, in that a nanofabric article may be disposed between the electrodes to cause the article to deflect toward or away from one electrode or the other. These embodiments may utilize a combination of volatile and non-volatile characteristics; for example, information state may be non-volatile, but the device may use a three-trace architecture in which the deflection of the nanotube article may be caused by a trace having volatile state characteristics.

Nanofabrics or ribbons, created by growth or application of individual tubes have been shown to substantially conform to substrate surfaces, such as a surface of a semiconductor substrate. Preferred embodiments of the present make devices such as electromechanical switches and memory cells using nanofabrics that conform to a surface which is substantially perpendicular to a semiconductor substrate (i.e. the nanofabrics are vertically-oriented, relative to a horizontal substrate). Devices and fabrication techniques to develop such vertically-disposed devices are described below, and include the ability to form switches and memory cells having relatively short spans of vertically suspended nanofabric articles with corresponding reductions in gap heights. In some embodiments, this allows for the use of smaller device dimensions and lower electrical resistances (and corresponding decreased cycling times and increased speed, e.g., performance up 100 GHz or more). Volatile and non-volatile switches, and numerous types of devices, examples of which are provided for illustration, can be thus created. In certain preferred embodiments, the articles are substantially a monolayer of carbon nanotubes.

Figure 1A:
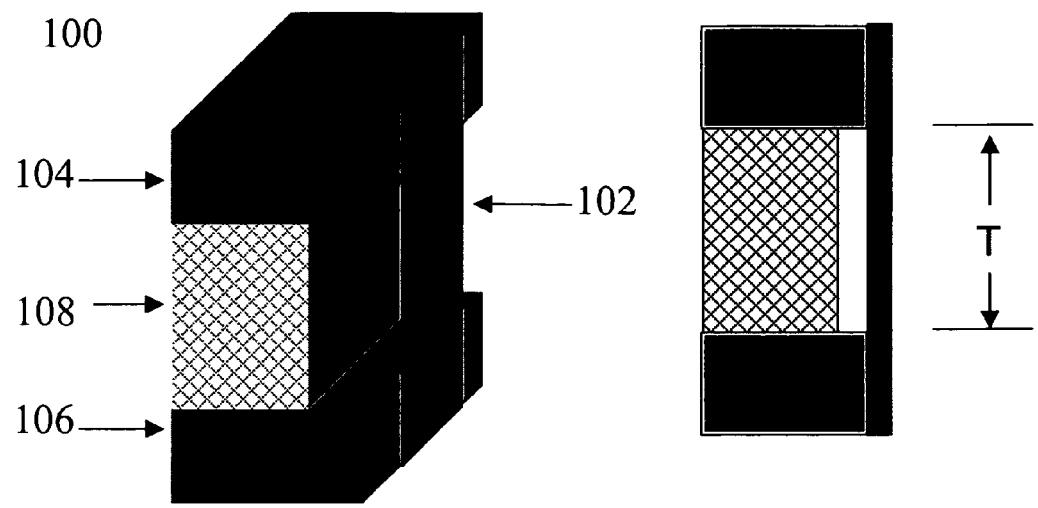
FIGS. 1A-B are perspective and cross-sectional views of an exemplary electromechanical switch.
Figure 1B:
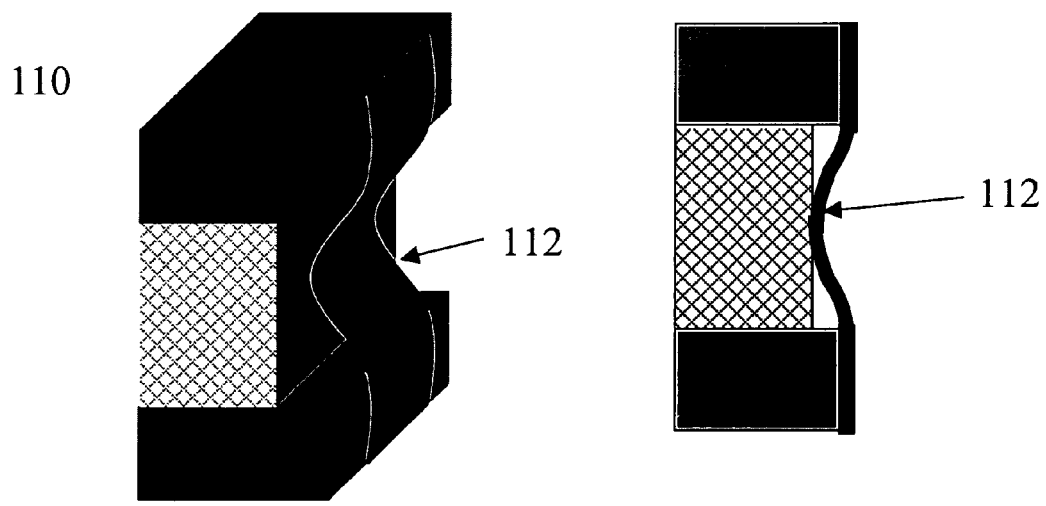

FIGS. 1A-B are perspective and cross-sectional views of an exemplary electromechanical switch. Structure 100 (FIG. 1(A)) depicts an "off" state and structure 110 (FIG. 1(B)) depicts an "on" state. The designations "on" and "off" are in some sense arbitrary, and this notation may be reversed with no loss of generality. In this embodiment, the structure contains nanofabric article 102 spanning between an upper insulating support structure 104 and a lower insulating support structure 106. Disposed between upper and lower insulating support structures 104 and 106 is an electrode 108.

Note that reference to a nanofabric, such as nanofabric article 102, is generally meant to include any suitable structure or article comprising nanotubes, and specifically includes ribbons and nanofabric electrodes containing nanotubes.

Figure 5A:
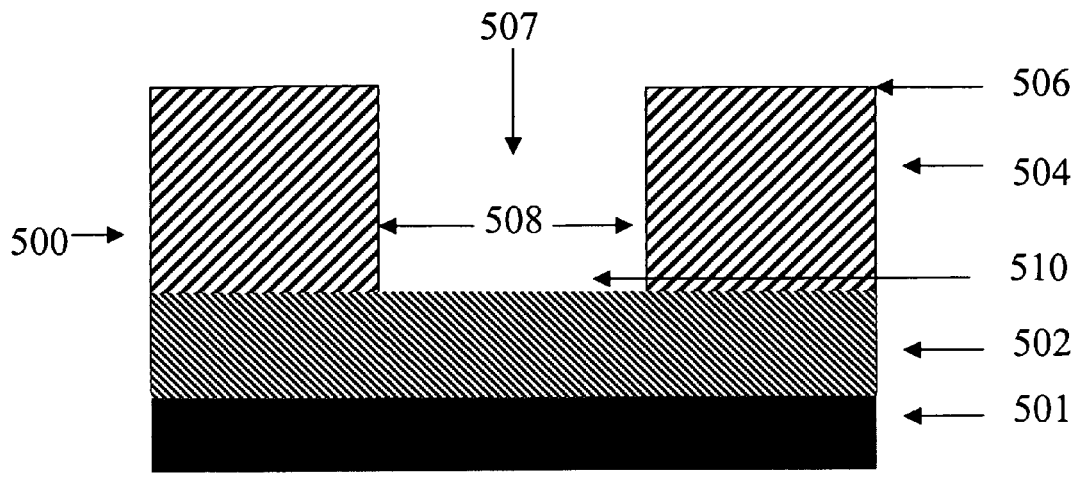
FIGS. 5A-L illustrate an exemplary method of fabricating devices according to certain embodiments of the invention.
Figure 5B:
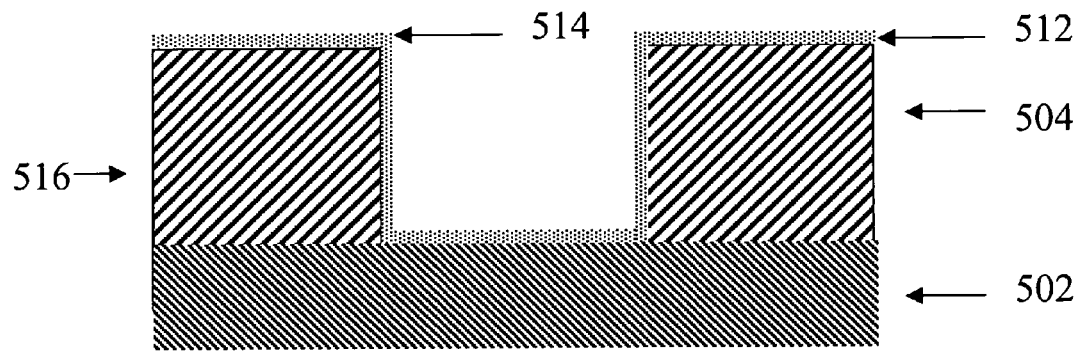
Figure 5C:
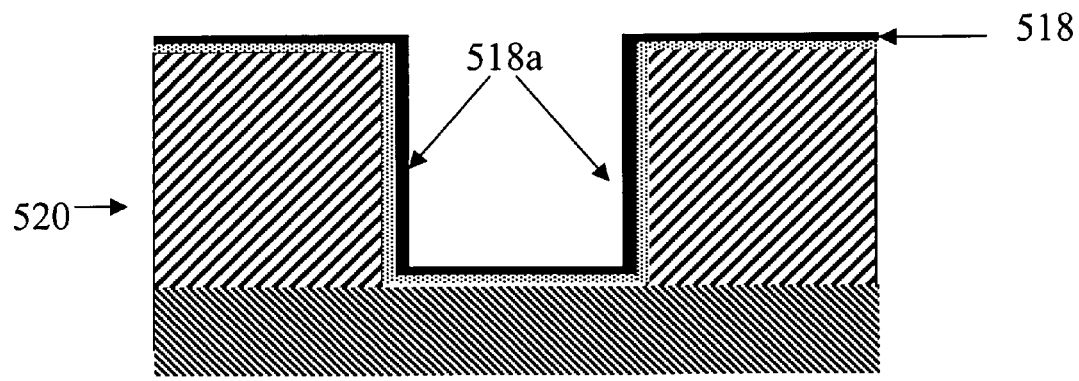
Figure 5D:
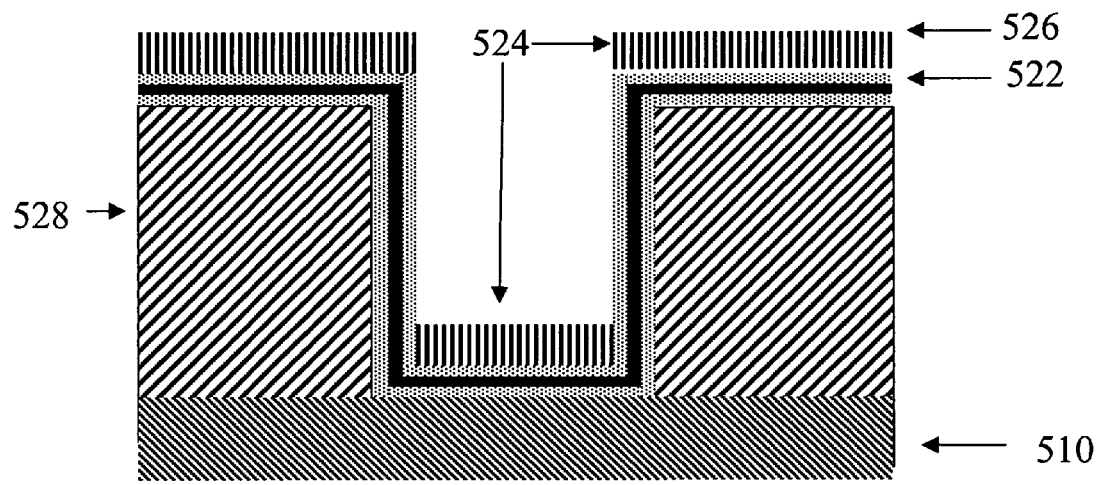
Figure 5E:
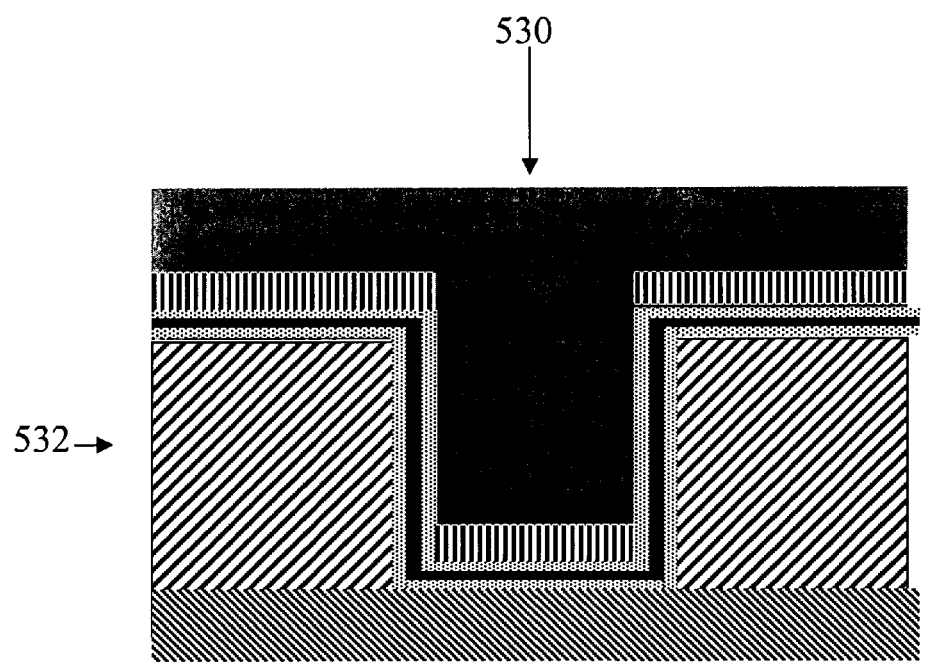
Figure 5F:
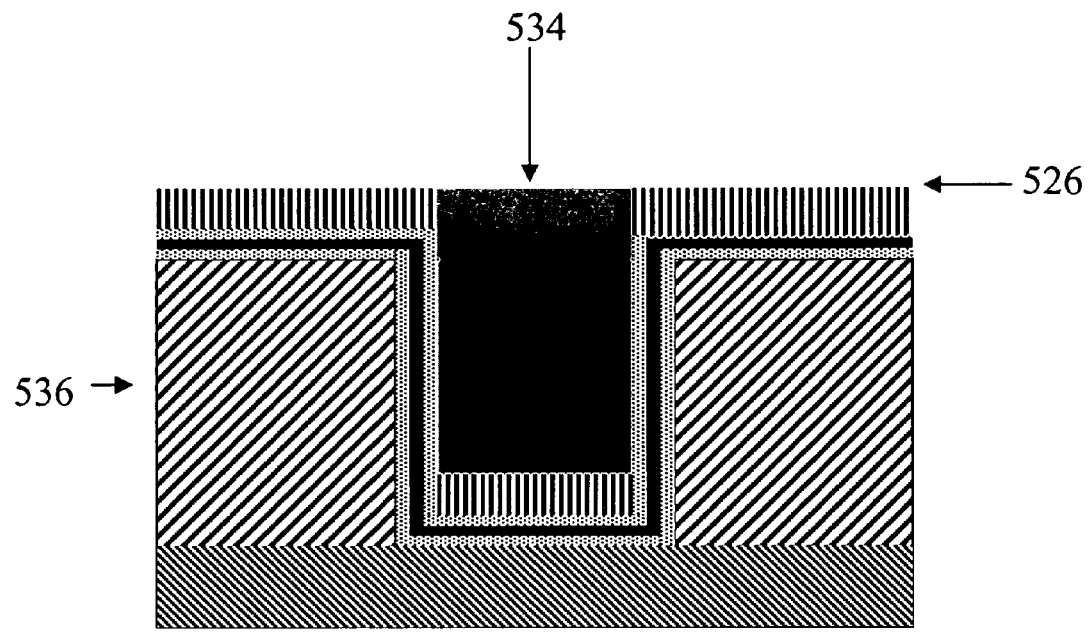
Figure 5G:
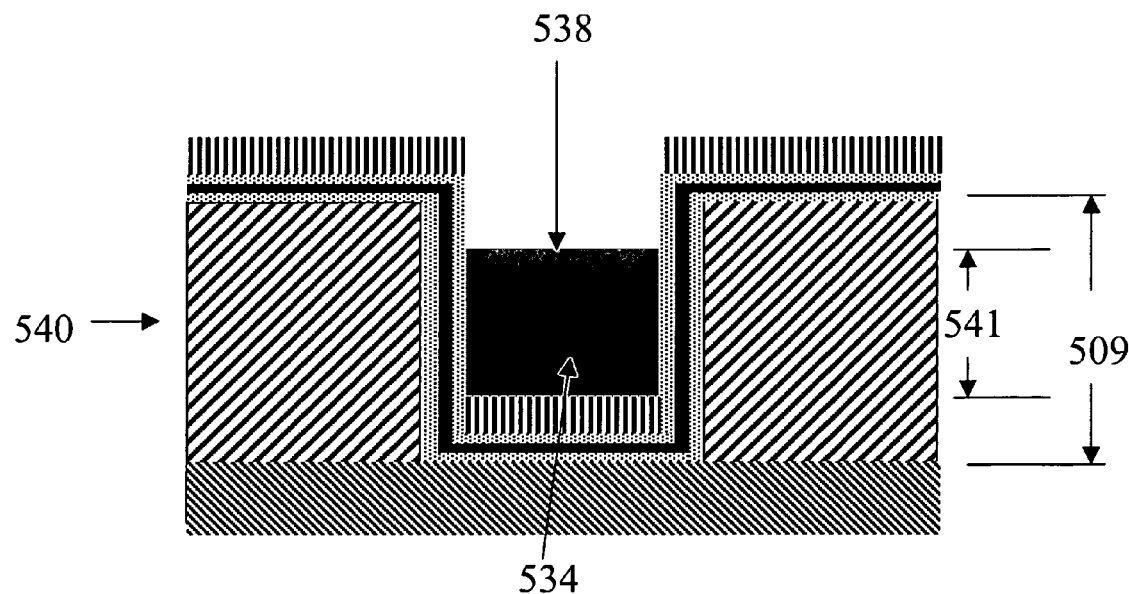
Figure 5H:
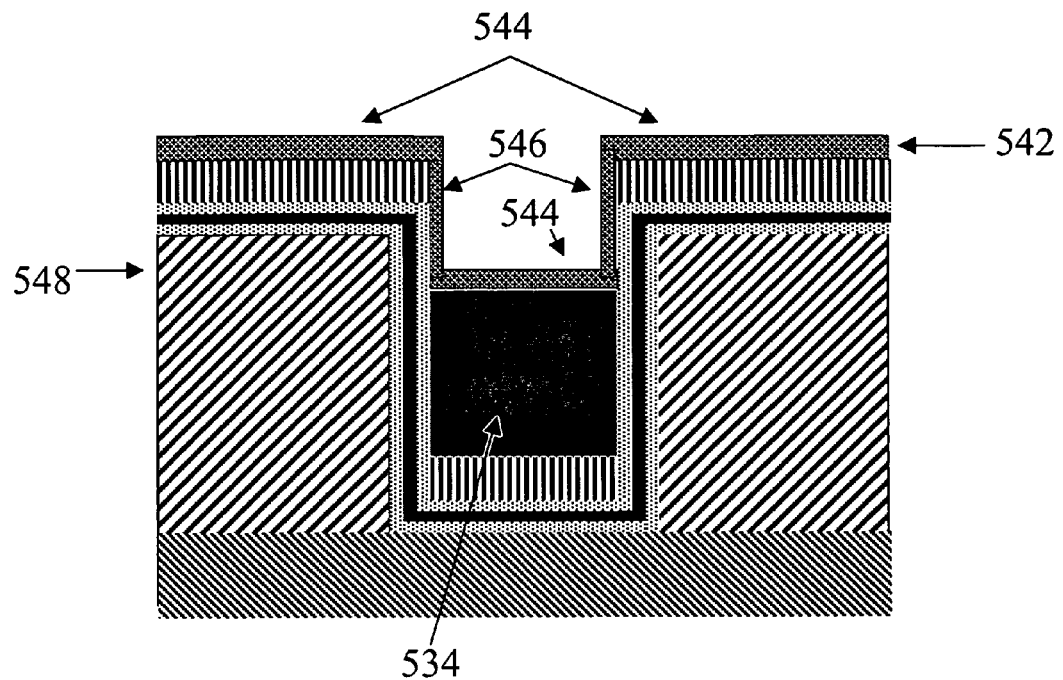
Figure 5I:
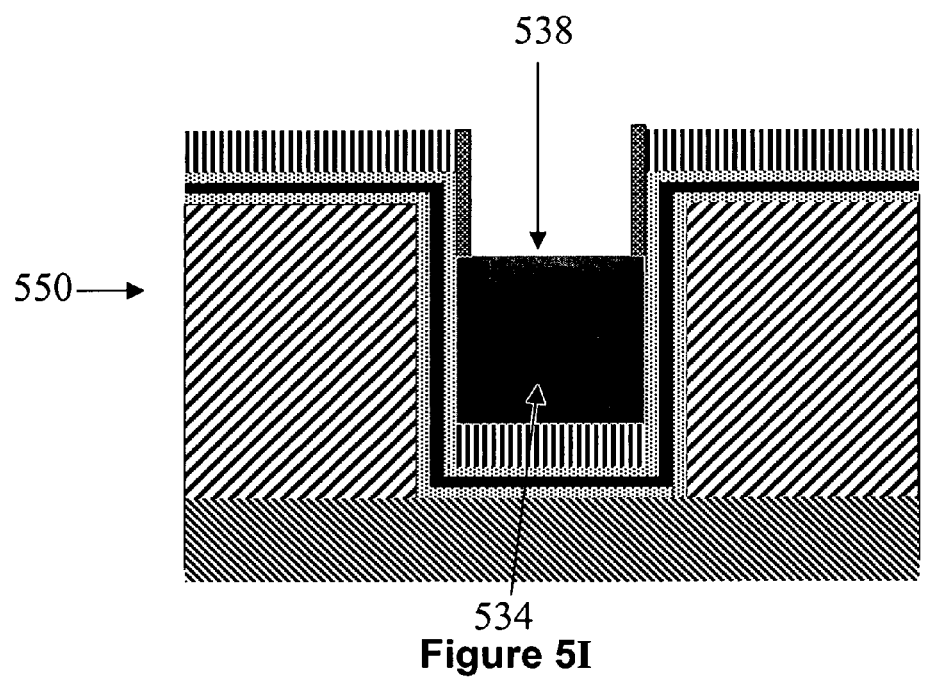
Figure 5J:
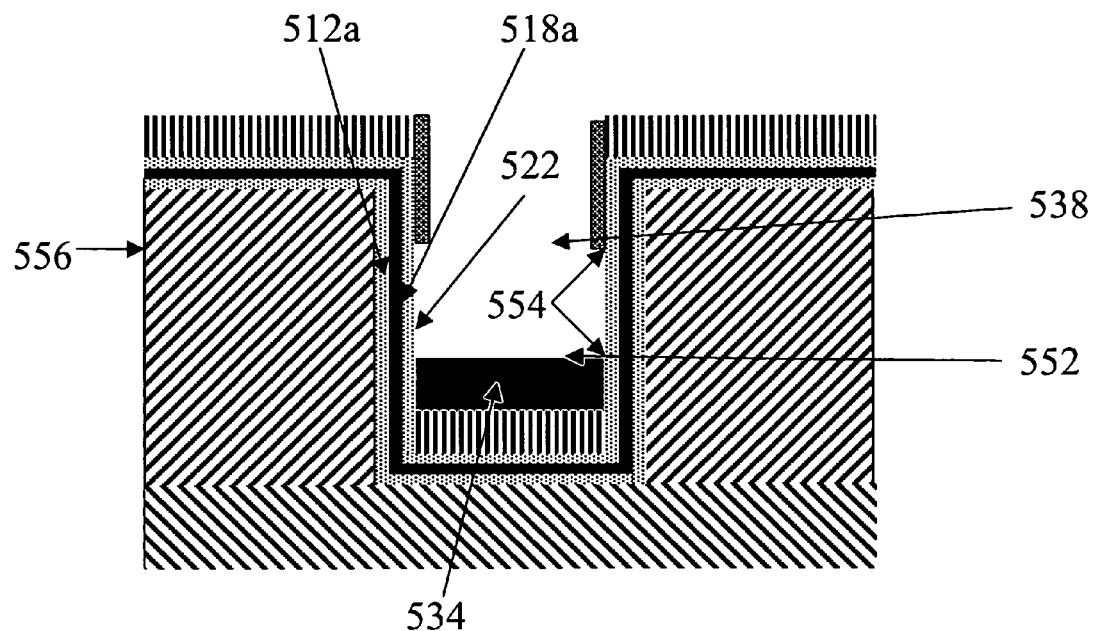
Figure 5K:
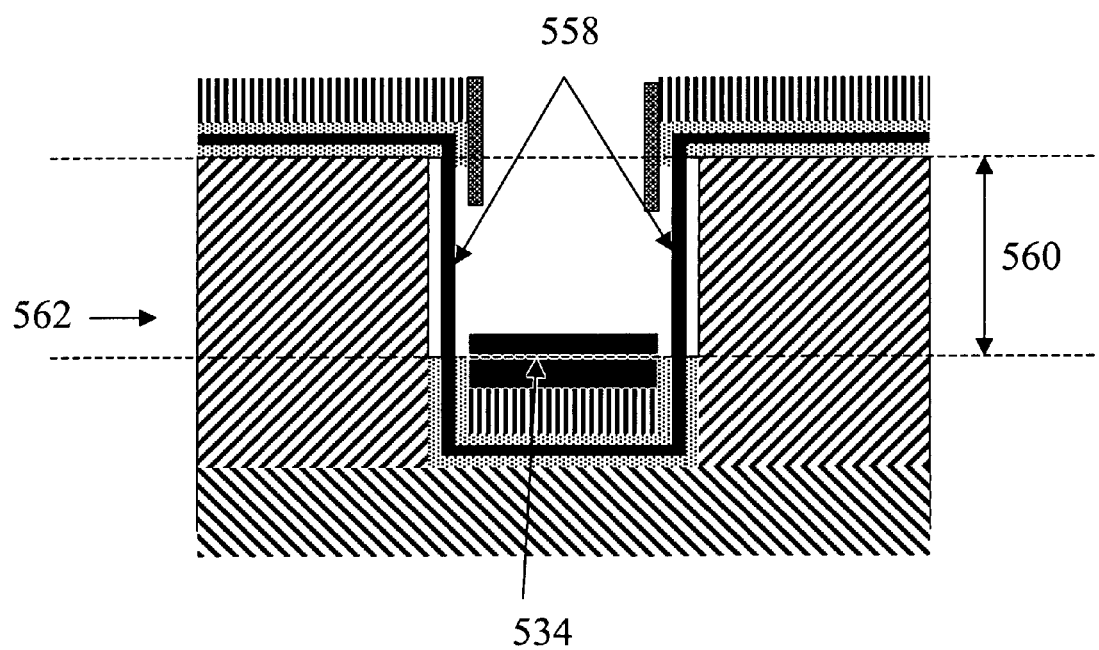
Figure 5L:
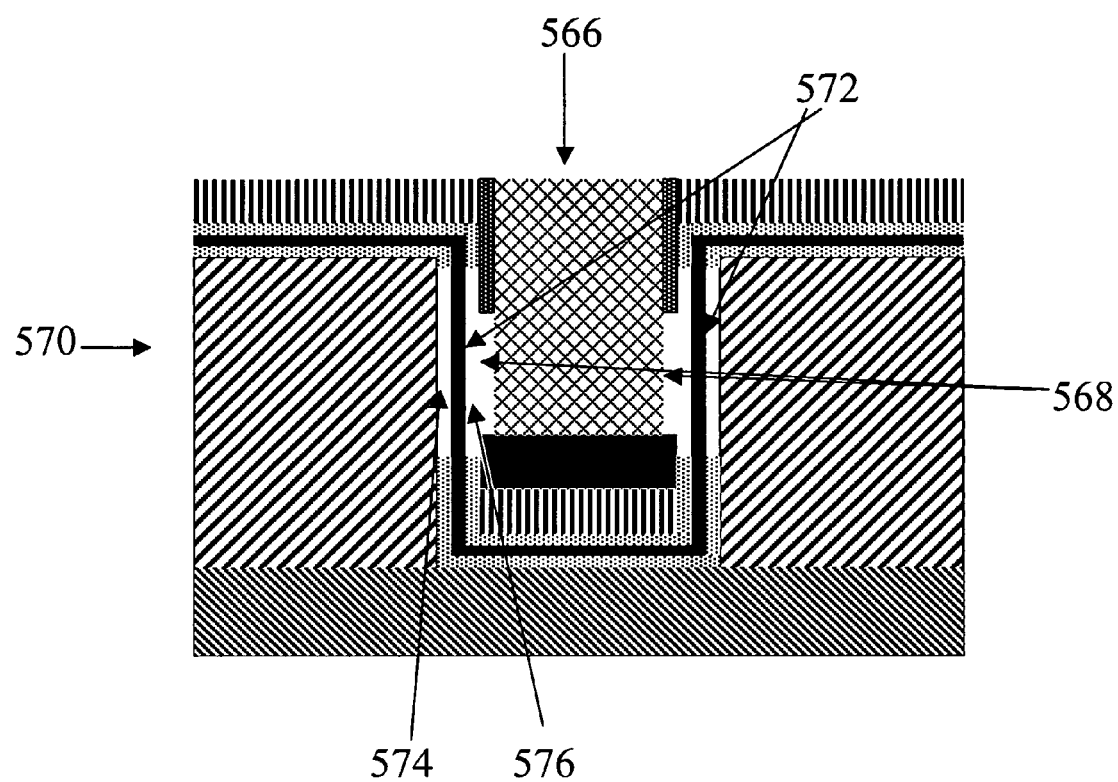

Under certain preferred embodiments, a nanofabric article 102 has a span T of less than about 180 nm or smaller and is pinned to insulating support structures 104 and 106 (seen more clearly in FIG. 5L). The span of nanofabric will depend on deposition technique used, and under certain embodiments suspended spans can be shorter than lithographically-produced spans. The inventors envision vertical spans as small or smaller than 30 nm. Pinning of nanofabric articles is described here and elsewhere in the incorporated references in more detail. The electrode 108 may be made of any suitable electrically conductive material and may be arranged in any of a variety of suitable geometries. Certain preferred embodiments utilize n-doped silicon to form such a conductive element which can be, preferably no wider than the nanofabric article 102, e.g., about 180 nm or below. Other embodiments utilize metal as conductor. In certain embodiments the electrode 108 can be constructed from a nanofabric as well.

The material of the insulating support structures 104 and 106, likewise, may be made of a variety of materials and into various geometries, but certain preferred embodiments utilize insulating material, such as spin-on-glass (SOG) or silicon nitride or silicon oxide.

As will be explained below, in certain embodiments, the nanofabric article 102, as shown is held to the insulating support structures by friction. In other embodiments, the nanofabric article 102 may be held by other means, such as by anchoring, stitching or pinning the nanofabric to the insulating support structures using any of a variety of techniques.

Specifically, the nanofabric article 102 may be coupled to another material by introducing a matrix material into the spaces between nanotubes in a porous nanofabric to form a conducting composite junction, as described in the references incorporated above. Electrical and mechanical advantages may be obtained by using such composite junctions and connections. In one example, a conducting material is deposited onto the nanofabric and is allowed to penetrate into the spaces within the porous nanofabric, thus forming an improved electrical connection to the nanofabric and reduces contact resistance in the article. In another example, an insulating material is deposited onto the nanofabric and is allowed to penetrate into the spaces within the porous nanofabric, thus forming an improved mechanical pinning contact that increases reliability and manufacturability.

Evaporated or spin-coated material such as metals, semiconductors or insulators especially—silicon, titanium, silicon oxide or polyamide—may be used to increase the pinning strength. The friction interaction can be increased through the use of chemical interactions, including covalent bonding through the use of carbon compounds such as pyrenes or other chemically reactive species. See R. J. Chen et al., "Noncovalent Sidewall Functionalization of Single-Walled Carbon Nanotubes for Protein Immobilization," J. Am. Chem. Soc., vol. 123, pp. 3838-39 (2001), and Dai et al., Appl. Phys. Lett., vol. 77, pp. 3015-17 (2000), for exemplary techniques for pinning and coating nanotubes by metals. See also WO 01/03208 for techniques.

In some embodiments in which a nanofabric article 102 is spaced apart from and crosses a corresponding, oppositely-disposed electrode, the intersection defines a memory or logic cell, switch or relay. More than one memory cell can be used in arrays or as individual or small groups of interconnected switches depending upon the application such as embedded memory, a two-chip memory device, relays or actuators. The actual number of such cells is immaterial to understanding the invention, but the technology may support devices having information storage capacities at least on the order of modern nonvolatile circuit devices.

FIGS. 2A-4C are cross-sectional diagrams of individual nanoswitches illustrating various states of the device.

Figure 2A:
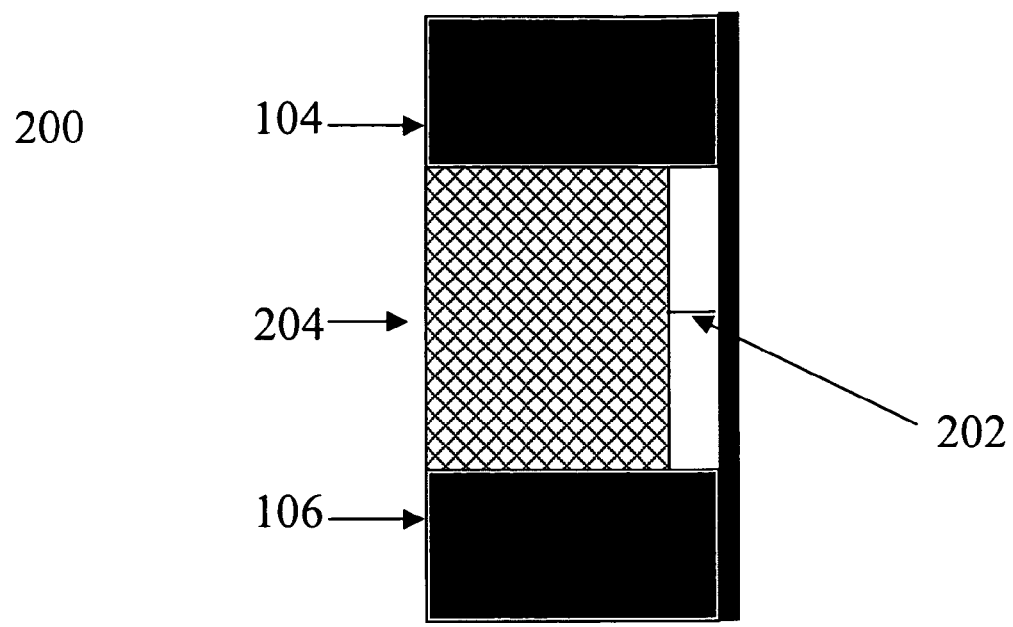
FIGS. 2A-B are cross-sectional views of devices according to certain embodiments of the invention.
Figure 2B:
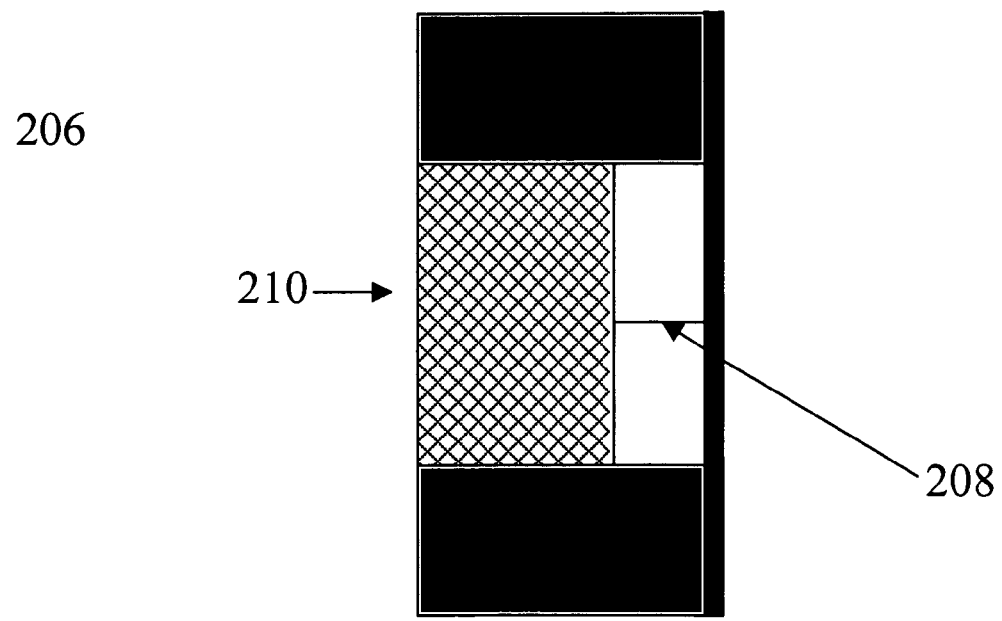

FIGS. 2A-B illustrate nanoswitches with different gap distances 202 and 208 between nanofabric article 102 and electrodes 204 and 210, respectively. In preferred embodiments, the vertical spacing between the insulating support structures 104 and 106 is less than 180 nm; this height is dependent upon the deposition technique used. In the case of a switch with a 180 nm span of suspended fabric, the relative separation, i.e. gap distance 202, from the top of insulating support structure 104 to the deflected position where the nanofabric article 102 attaches to electrode 204 should be approximately 5-50 nm. In switches with smaller spans, the gap would likely also be smaller. The magnitude of the gap distance 202 is designed to be compatible with electromechanical switching capabilities of the memory device or other electronic application. The 5-50 nm gap distance is preferred for certain embodiments utilizing nanofabrics 102 made from carbon nanotubes, and reflects the specific interplay between strain energy and adhesion energy for the deflected nanotubes. Other gap distances may be preferable for other materials. Switching between these states is accomplished by the application of specific voltages across the nanofabric article 102 and one or more of its associated electrodes, e.g. 204, 210. Switching forces are based on the interplay of electrostatic attraction and repulsion between the nanofabric article 102 and the electrodes, e.g. 204, 210.

By selecting a gap distance 202 in which the strain energy is lower than the adhesion energy the nanofabric article 102 can remain in permanent "non-volatile" contact with the electrode 204. If a larger gap distance 208 were selected, the strain energy increases to such an extent as to allow the nanofabric article 102 to contact the electrode 210 but not to remain in such contact without additional power input, defining a "volatile" condition. In some embodiments, such a volatile switch is preferred and can be combined with non-volatile switches as is necessary to generate particular electronic devices.

The dimensions given above are exemplary and non-limiting, and can be greater or smaller in some embodiments, depending on the application and materials and techniques used. The length of the nanofabric article 102 in these and other vertically-disposed articles can be quite short in comparison to other types of nanofabric articles. In some cases, thin film techniques, such as thin film deposition or etching can be used rather than using lithographic techniques to form the electrodes and gaps spanned by the suspended nanofabric ribbons. In some embodiments the suspended length can be shorter than the length of the nanofabrics used in horizontally disposed devices, such as those in the incorporated reference entitled "Electro-Mechanical Switches and Memory Cells Using Horizontally-Disposed Nanofabric Articles and Methods of Making the Same" (U.S. Provisional Pat. Apl. Ser. No. 60/446,783), filed on Feb. 12, 2003; filed on even date herewith U.S. Apl. Ser. No. yet to be assigned). The dependence on thin film deposition rather than lithographic patterning of the devices makes for more facile manufacturing.

A short span of nanofabric can lead to enhanced reliability and vastly increased switching speeds up to 200 GHz for concomitantly lowered gap heights. Also, shorter spans of nanofabric result in reduced electrical resistance to current flowing through the nanofabric. Further embodiments, below, illustrate other types of vertically-disposed articles, and methods of manufacturing the same.

Figure 3A:
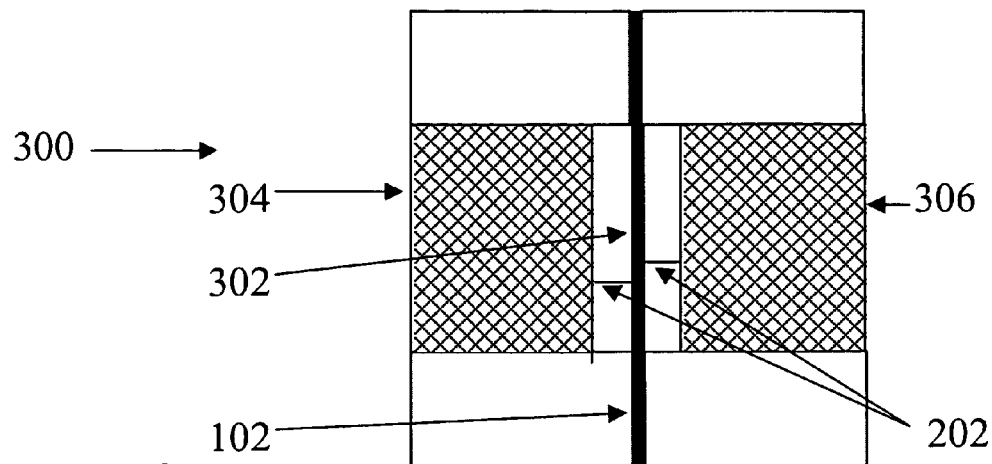
FIGS. 3A-4C are cross-sectional diagrams of three-trace devices according to certain embodiments of the invention.
Figure 3B:
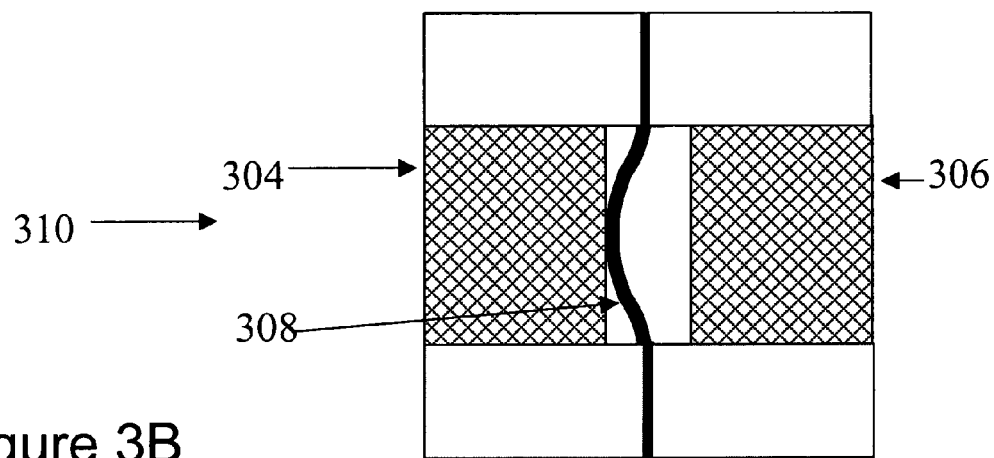
Figure 3C:
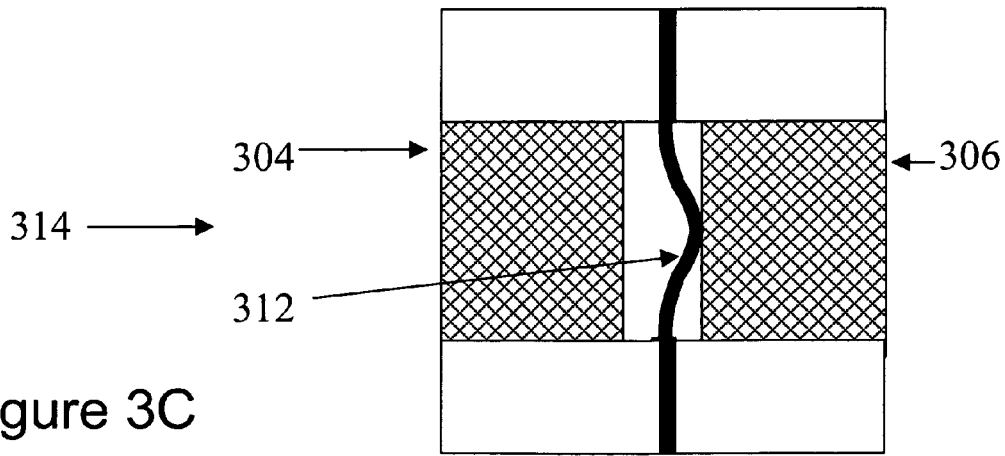

FIGS. 3A-C illustrate two possible "on" states of certain embodiments of the invention. When the device is as illustrated by 302 (FIG. 3A, structure 300), the nanofabric article 102 is separated from both electrodes 304 and 306 by a distance 202. This state may be electrically detected in any of a variety of ways described in the foregoing references incorporated by reference. In this arrangement, an "off" state corresponds to nanofabric-electrode junction being an open circuit, which may be sensed as such on either the nanofabric article 102 or electrode 304 when addressed. When the cell is as shown by 308 (FIG. 3B, structure 310), the nanofabric article 102 is deflected toward electrode 304. In certain embodiments the "on" states corresponding to the nanofabric-electrode junction is an electrically conducting, rectifying junction (e.g., Schottky or PN), which may be sensed as such on either the nanofabric article 102 or electrode 306 when addressed. When the cell is as shown by 312 (FIG. 3C, structure 314), the nanofabric article 102 is deflected toward electrode 306 generating an "on" state. The figures are not drawn to scale, and the distances 202, for example, need not be equal. Alternatively, one or the other of the electrodes may act as "set" electrode used alone or in combination with the other electrode to cause the nanotube article to deflect into contact with an electrode, and the other of the electrodes may act as a "release" electrode used alone or in combination with the other electrode to cause the nanotube article to release from contact with the electrode.

Figure 4A:
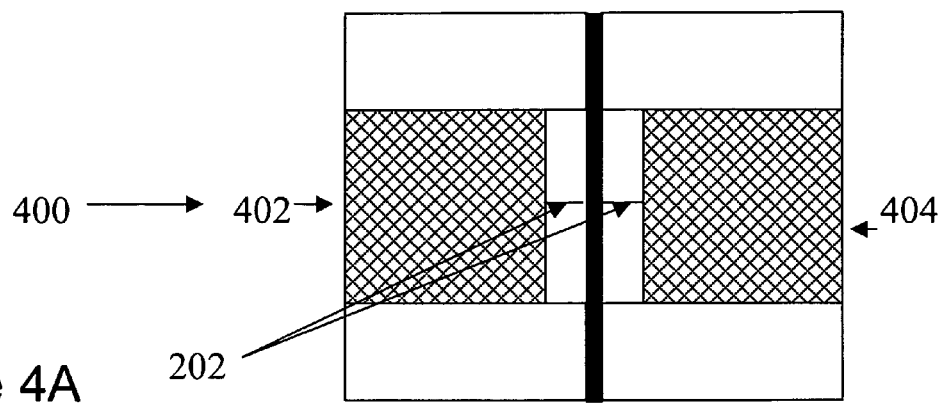
Figure 4B:
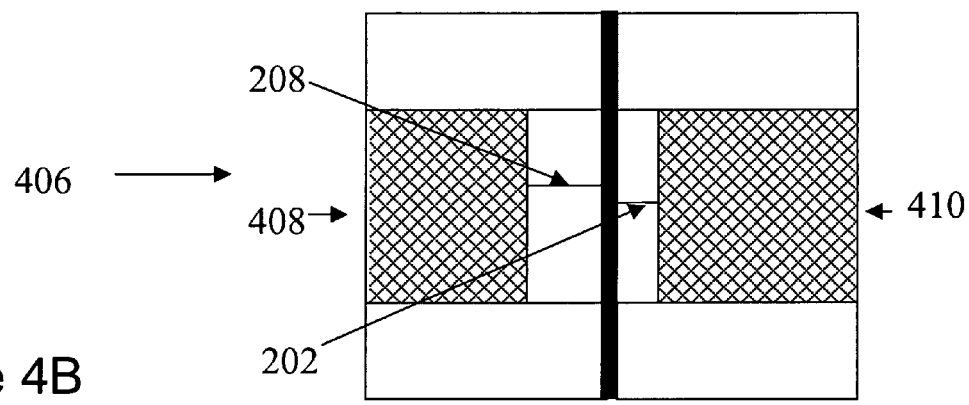
Figure 4C:
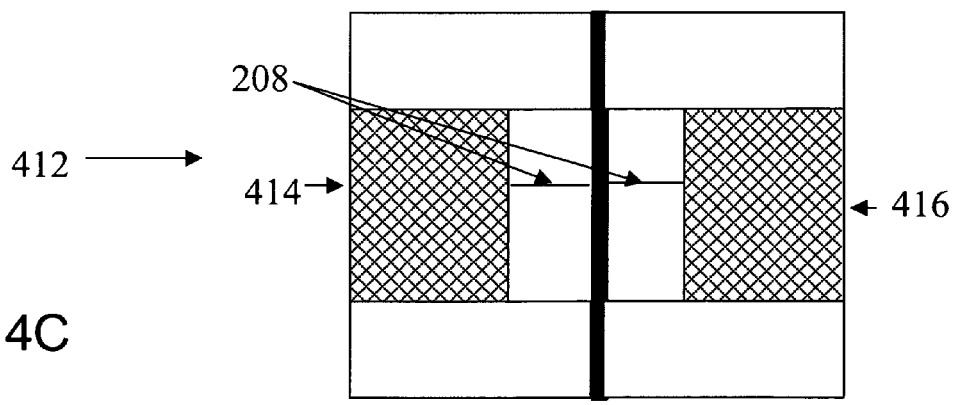

FIGS. 4A-C illustrate some other possible tristate or tri-trace device configurations. A first tri-trace device 400 (FIG. 4A) has two non-volatile "on" states. The distance 202 between the non-deflected nanofabric article 102 and either electrode 402 or 404 is small enough that upon deflection the nanofabric contacts either electrode 402 or 404. Under this embodiment a stable van der Waals interaction is formed yielding a non-volatile condition in which the deflected nanofabric article 102 contacts either electrode, closing a circuit and remaining in contact with the electrode indefinitely without the need for additional power.

A second tri-trace device 406 (FIG. 4B) allows for nanofabric deflection to be either non-volatile or volatile. If the nanofabric article 102 deflects toward electrode 410, then the distance 202 is small enough to allow for a nonvolatile state as above. If, however the nanofabric article 102 is deflected toward electrode 408, then the gap distance 208, between the nanofabric article 102 and the contacted electrode 408 has been increased such that the strain energy of the stretched nanofabric article 102 overcomes the van der Waals attraction between the nanofabric article 102 and the electrode 408; the nanofabric article 102 briefly forms part of a closed circuit generating a transient "on" state and returns to its non-deflected, open circuit state generating an "off" state.

Compare structure 400, which may be used as non-volatile switch, to structure 406, which includes a volatile switch with gap 208. In structure 406 the gap height 208 between the nanofabric and the electrode 408 has been increased such that the strain energy of the stretched nanofabric overcomes the van der Waals attraction between the fabric and the electrode.

The nanofabric forms part of a closed circuit and returns to its non-deflected, open circuit state. It should be noted that the effect of the van der Waals interaction between nanofabrics and other elements can be affected at their interface(s). The effect may be enhanced or diminished; e.g., the attractive force can be diminished by coating the surface of the electrode with a thin layer of oxide or other suitable materials. A purpose of this diminishing of attractive forces may be to create volatile nanoswitches; such volatile switches may be especially useful in applications such as relays, sensors, transistors, etc.

Structure 412 (FIG. 4C) illustrates yet a third tri-trace device where the gap distances 208 between the nanofabric article 102 and the electrodes 414 and 416 are large enough to form volatile nanoswitches as described above.

In certain embodiments involving a non-volatile cell, there is a high ratio between resistances in the "off" and the "on" states. The differences between resistances in the "off" and "on" states provides a means to read which state a junction is in. In one approach, a "readout" current is applied to the nanofabric or electrode and the voltage across the junction is determined with a "sense amplifier" on the electrodes. Reads are non-destructive, meaning that the cell retains its state, and no write-back operations are needed as is required with semiconductor DRAMs. As alluded to above, the three-trace junctions of preferred embodiments bring their own advantages. By allowing for use of tristate memory cells, more information may be stored or represented by a given cell. Moreover, even if only one of the "on" states were used, three-trace junctions may increase switching speeds from the ability to use both conductive traces in concert to apply forces to move an electromechanically responsive nanofabric 102.

Among other things the structures as shown in FIGS. 3 and 4 (generally) facilitate packaging and distribution, and allow the nanotube-technology cells to be more easily incorporated into other circuits and systems such as hybrid circuits. The vertical nature of the electrical architecture can also facilitate the production of stackable memory layers and the simplification of various interconnects. Preferably, the nanotube patch or segment is clamped (above and below) up to the portion of the nanofabric article that is so suspended. In addition, preferably, the nanofabric article is connected or joined to high conductivity signal paths.

One aspect of the present invention is directed to formation of conductive composite junctions whereby a suitable matrix material is disposed within and around the nanotubes or fibers of a nanofabric or other porous nano material. Such junctions can provide desirable mechanical and/or electrical properties. For example, electrical contact between a nanofabric and a metal connection or activation point may be enhanced, or the contact resistance may be decreased by applying the metal contact as a matrix material impregnating the nanofabric tubes. Also, mechanical contact and strain may be increased as a result of the increased contact between the nanotubes and the matrix material.

Cross-sectional FIGS. 5A-L, collectively, illustrate an exemplary method of fabricating a substantially vertical nano-electromechanical switch. By vertical it is meant that the switching element is substantially perpendicular to the major surface of the substrate. This aspect will be illustrated and described in detail below. Certain advantages can be realized in manufacturing such device using conformal nanotube and/or nanofabric materials. As a result, the length of the nanofabric article can be reduced in some embodiments by about two orders of magnitude. Additionally, the electrical resistance of a current-carrying nanofabric article is substantially reduced when the length of the article is reduced, as described herein.

In FIG. 5A, a semiconductor substrate 501 coated with an insulating layer 502 such as silicon dioxide or silicon nitride is provided. The insulating layer 502 is preferably a few nanometers in thickness but could be as much 1 µm thick depending upon the electrical characteristics desired for different applications. A second layer 504 is deposited on insulating layer 502. Two non-exclusive examples of the material the second layer 504 can be made from are metals and semiconductors; the second layer having a top surface 506. A cavity 507 is defined in the second layer 504. The cavity 507 can be created by reactive ion etching into the second layer 504; the cavity 507 is defined by inner walls 508 and an exposed top surface 510 of insulating layer 502. In certain embodiments, a portion of second layer 504 remains such that the bottom of the cavity 507 is conductive. Alternatively, an insulating layer 502 could be provided to top surface 506 which could be etched to generate a cavity. The cavity 507 can be prefabricated as part of a trench or a via provided as part of preprocessing steps, e.g., as part of an overall integration scheme in generation of an electronic device.

FIG. 5B illustrates a first insulating layer 512 made of silicon nitride or other material deposited on top of the exposed top surface 510 and top surface 506 to generate top layer 514 of intermediate structure 516. According to one embodiment, the first insulating layer 512 is selectively etchable over polysilicon, nanotubes and silicon oxide or other selected insulator. A first insulating layer 512 which will act as a sacrificial layer to create a gap between subsequent layers can be in a range of thicknesses described below as shown in intermediate structure 516.

FIG. 5C illustrates a monolayer of nanofabric 518 applied to intermediate structure 516, forming intermediate structure 520. The nanofabric 518 may be applied by chemical vapor deposition, spin coating of suspensions of nanotubes, aerosolized nanotube suspensions or dipping into a solution of suspended nanotubes.

Nanofabric layer 518 conforms to the underlying insulating layer 512 and substantially follows the geometry of cavity 507. Examples of nanofabric articles and methods of manufacturing and using the same can be found in the previously-mentioned and incorporated references. The resulting structure 520 thus includes two vertical portions 518A of the nanofabric 518 which is perpendicular to the major surface of the substrate 501. Devices created using these vertical portions substantially parallel to channel 507 side walls 508, e.g. nano-switches, are termed "vertical" devices or switches.

FIG. 5D illustrates a second insulating layer 522 applied over nanofabric 518. Protective insulating layer 524 is deposited on top of second insulating layer 522 having top surface 526, forming intermediate structure 528. The protective insulating layer 524 is not deposited on the side walls of the channel. The thickness of protective insulating layer 524 can be, for example, on the order of 100 nm, and a non-exclusive example of the method of application of protective insulating layer 524, which may be an oxide layer, is by sputtering or high density plasma deposition of silicon dioxide. The optimal thickness is determined by the particular application to protect the layers below the insulating layer 524 from additional etching or deposition steps.

FIG. 5E illustrates a polysilicon layer 530 deposited on top surface 526 of intermediate structure 528, filling the space between walls 508 in cavity 507. Polysilicon layer 530 can be deposited to a height greater than that of top surface 526 in order to get the proper amount of polysilicon layer into cavity 507, creating an overfilling condition as in intermediate structure 532. Polysilicon layer 530 is subsequently planarized to etched polysilicon 534 with top surface 526 of oxide layer 524 as is illustrated by intermediate structure 536 (FIG. 5F).

FIG. 5G illustrates polysilicon layer 534 etched to a first depth 538, by any appropriate method. An exemplary method of creating such a depth is by reactive ion etch (RIE) as shown in intermediate structure 540; first depth 538 later helps define one edge of a suspended nanofabric segment. The thickness 541 of etched polysilicon layer 534 is dependent on original trench depth 509; for example the depth may be in a range from 200 nm to 1 micron and for applications requiring ultrahigh speed electromechanical switches, the depth would preferably be below 200 nm. This depth can be reduced using thin film manufacturing techniques, as mentioned elsewhere in this document and in the documents incorporated by reference.

FIG. 5H illustrates a layer of oxide 542 deposited on exposed surfaces of intermediate structure 540. Horizontal portions 544 of oxide layer cover trench walls and vertical oxide layers 546 cover exposed, top surfaces of polysilicon layer 534. Horizontal oxide layers 544 are removed, e.g., by oxide spacer etching, leaving intermediate structure 550 (FIG. 5I).

FIG. 5J illustrates polysilicon layer 534 etched to a second depth 552. Second depth 552 may be approximately 50 nm deeper than first depth 538. The defined gap 554 allows exposure of regions of second insulating layer 522 as is shown in intermediate structure 556.

Since preferred nanofabrics are permeable or porous, the regions 512A of first insulating layer 512 below the regions of nanotube fabric 518A are removable, e.g. by wet etching. Removal of materials from beneath a porous nanofabric has been described by the present applicants in the patent references incorporated above. Suitable wet etching conditions to remove the layers of first insulating layer 512 and second insulating layer 522 leave a suspended nanofabric 558 having vertical height 560 as observed in intermediate structure 562 (FIG. 5K). The wet etching may leave an overhang owing to the nature of isotropic wet etching conditions. Other techniques such as dry etching may be utilized to provide an anisotropic etching step.

The vertical height 560 is defined by the etching procedure. For a vertical height 560 of 200 nm the thicknesses of first insulating layer 512 and second insulating layer 522 would be approximately 20 nm in order to provide gap distances to create two non-volatile states. Smaller vertical gaps may be preferred in certain embodiments of the invention, e.g. 30 nm gap heights.

Electrode material 566 is deposited into trench 507, leaving gaps 568 between electrode material 566 and suspended nanotube fabric 558 as shown in intermediate structure 570 (FIG. 5L).

The structure 570 illustrates a pair of vertically-suspended nanofabric portions 572 surrounded by vertical gaps 574, 576 on either side of each portion. The structure may serve as a basis for a pair of bi- or tri-state switching devices as is explained below. The behavior of the switching devices is influenced by the strain in the suspended nanofabric portions and the surrounding gap distances, as discussed herein. Also, many configurations, including common electrode (e.g. 566) configurations may be obtained using the structure 570. It is possible to split structure 570 into two discrete sections (left, right) by a vertical divide running vertically through electrode 566 for example, leaving two bi- or tri-state switches that can be independently operated.

In these and other embodiments, the nature of the resulting devices and switches depends on the construction and arrangement of the electrodes and connections, among other factors. Attention is called to the construction of various types of electrodes in the following embodiments, as an indication of the flexibility of the design and concepts underlying these devices and the variety of their potential uses. For example, some devices share common electrodes between more than one nanofabric article (e.g. two nanofabric switch elements being influenced by a same shared electrode). Other devices have separate electrodes that control the behavior of the nanofabric. One or more electrodes can be used with each nanofabric article to control the article, as mentioned in the incorporated reference entitled "Electromechanical Three-Trace Junction Devices" (U.S. patent application Ser. No. 10/033, 323), filed on Dec. 28, 2001.

If vertical height 560 is 200 nm and first insulating layer 512 and second insulating layer 522 are increased to a thickness of about 50 nm the nanotube switch of certain device types would become volatile at the necessary bias voltages because the deflected nanofabric has a strain energy higher than that of the van der Waals force keeping the fabric in contact with metallic region 504 or electrode 566. The thicknesses of first insulating layer 512 and second insulating layer 522 can be adjusted to generate either a non-volatile or volatile condition for a given vertical gap 560 as called for by particular applications with desired electrical characteristics.

Figure 6:
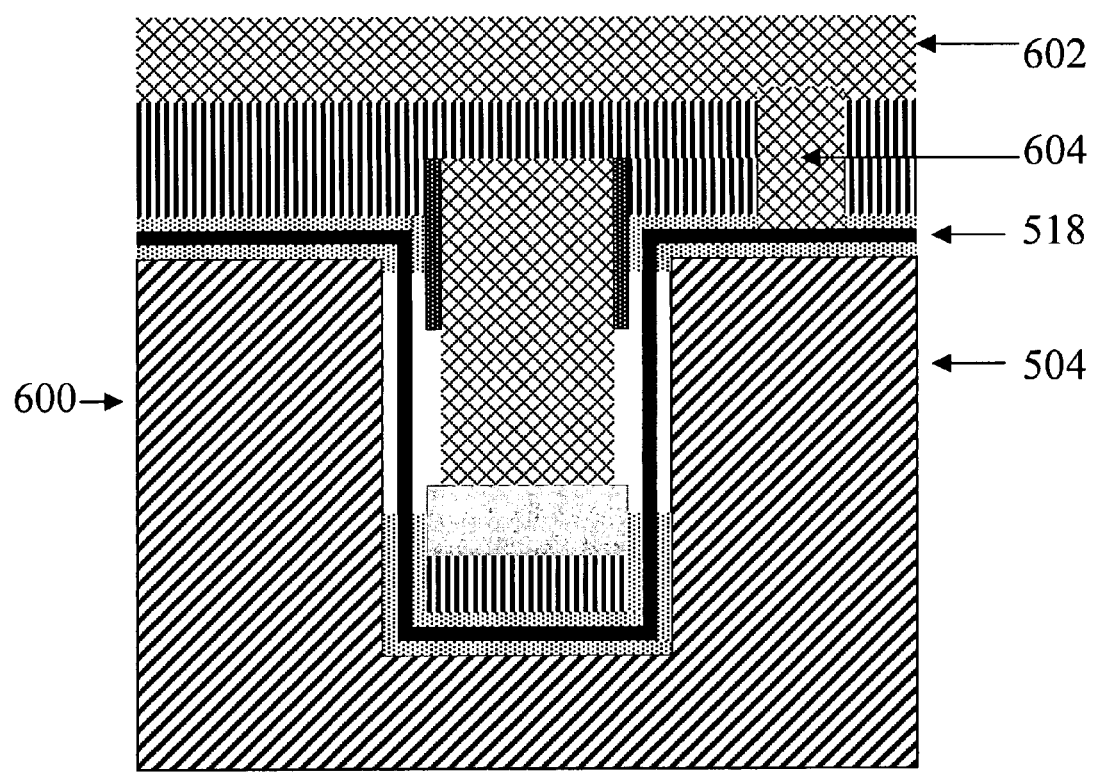
FIGS. 6-10 are cross-sectional views of various alternative embodiments of the invention.

Cross-sectional FIG. 6 illustrates an exemplary structure with subsequent layers of metallization. This structure includes electrode interconnect 602 and via 604 in contact with nanofabric 518, and a contiguous metallic layer 504 surrounding the electromechanical switch both laterally and subjacently, as shown in intermediate structure 600.

Figure 7:
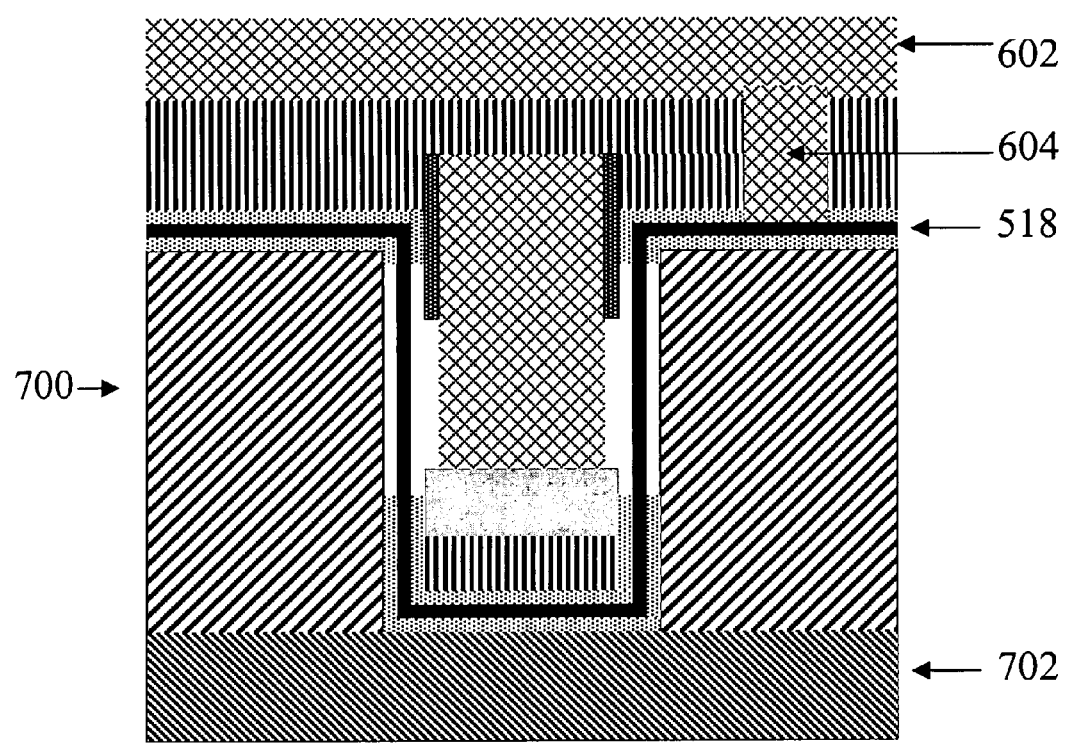

Cross-sectional FIG. 7 illustrates an exemplary structure with subsequent layers of metallization. This structure is similar to intermediate structure 600 in several respects. However, an insulating layer 702 separates the portions of metallic layers 504, and therefore metallic layer 504 does not surround the electromechanical switch elements, preventing crosstalk as shown in intermediate structure 600

Figure 8:
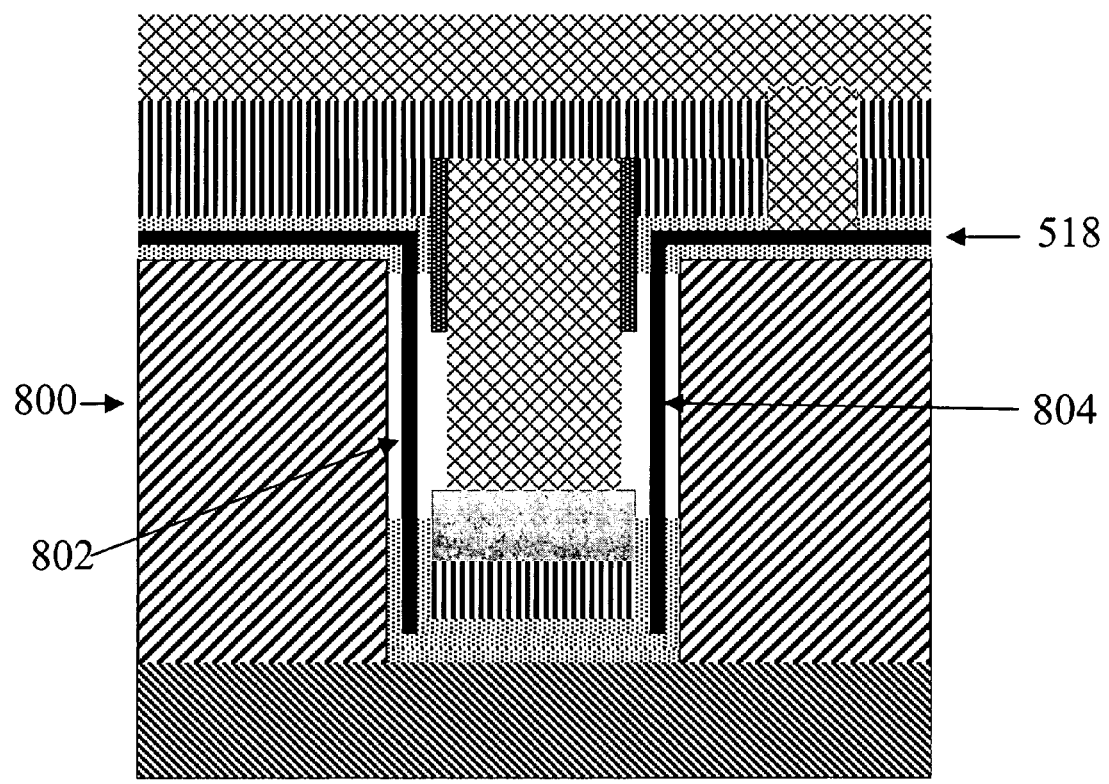

Cross-sectional FIG. 8 illustrates an exemplary structure with subsequent layers of metallization. This structure is similar to intermediate structure 700. However, the nanofabric layer 518 is not continuous, being split at the bottom and therefore there are two independent switches 802, 804, which have no crosstalk, as shown in intermediate structure 800.

Figure 9:
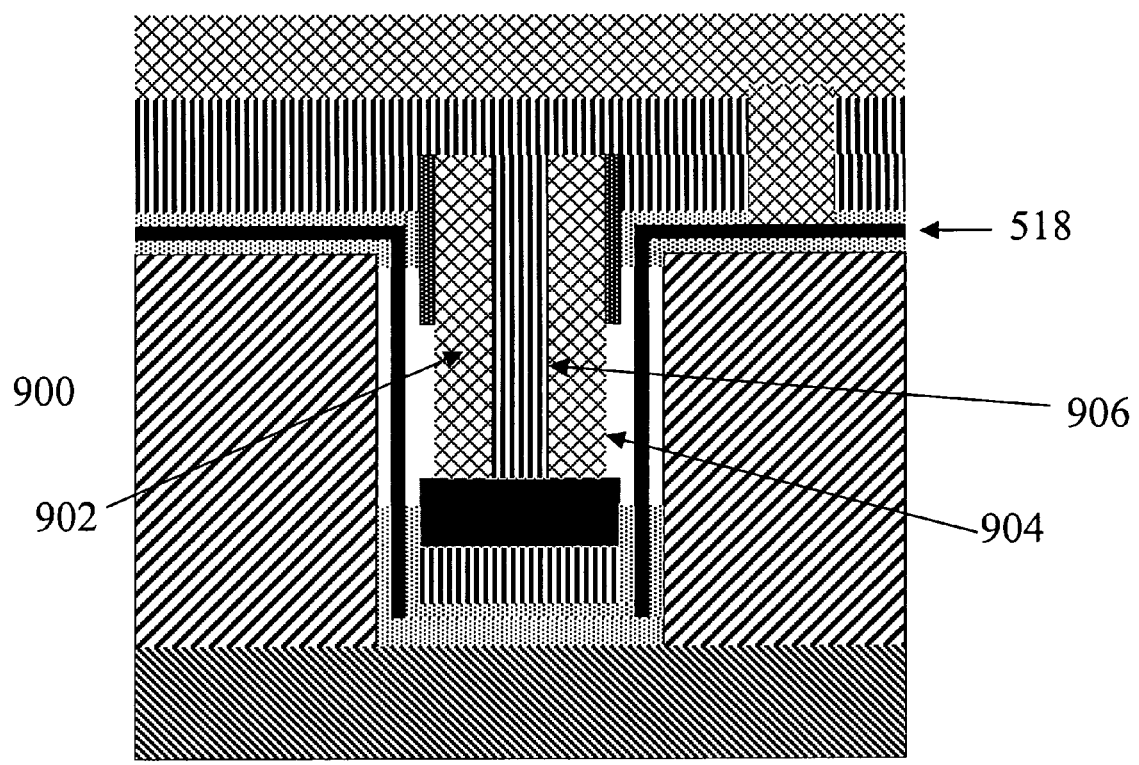

Cross-sectional FIG. 9 is an exemplary structure with subsequent layers of metallization. This structure is similar to intermediate structure 800; however, instead of a single central electrode, there are two central electrodes, 902, 904 separated by insulating layer 906. Thus, intermediate structure 900 has two nano-electromechanical switches, which can be operated independently.

Figure 10:
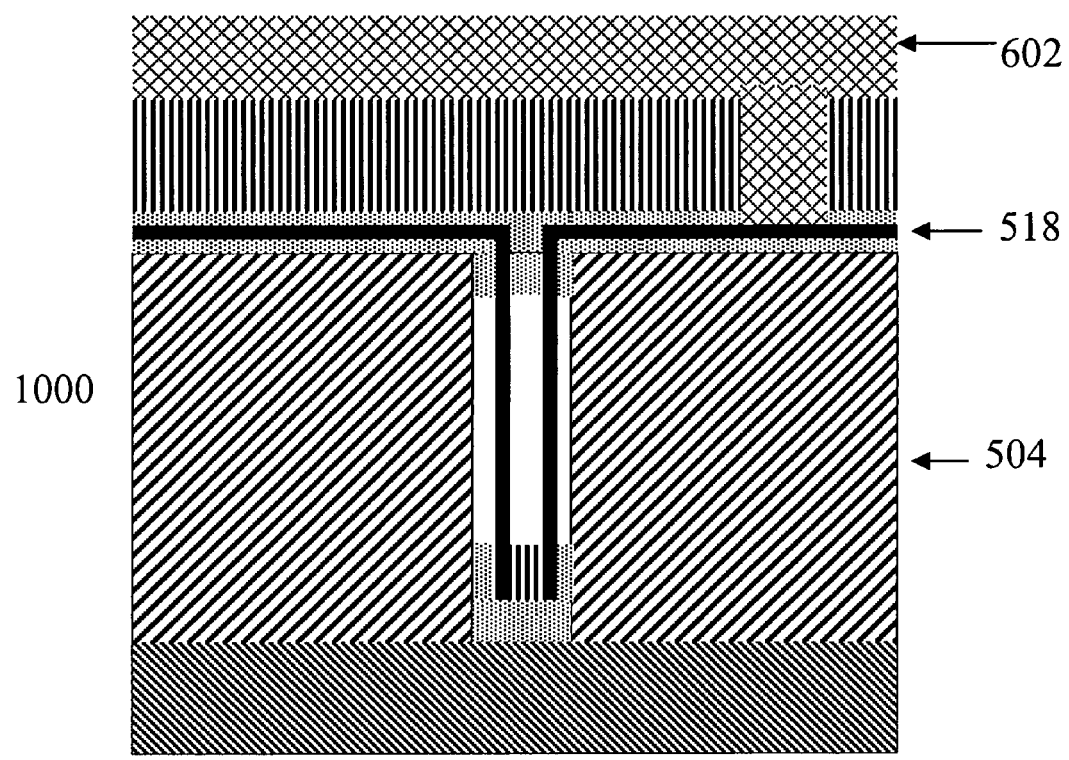

Cross-sectional FIG. 10 is an exemplary structure with subsequent layers of metallization. This structure is similar to intermediate structures 800 and 900, except there is no central electrode, at all. In this embodiment, it is possible for the nanofabric switches to contact metal layers 504 to make a volatile or non-volatile switch, and it is possible for the switches to contact one another so as to be volatile or non-volatile.

The devices and articles shown in the preceding embodiments are given for illustrative purposes only, and other techniques may be used to produce the same or equivalents thereof. Furthermore, the articles shown may be substituted with other types of materials and geometries in yet other embodiments. For example, rather than using metallic electrodes, some embodiments of the present invention may employ nanotubes. In fact, devices comprising nanotube and nanofabric articles in place of the electrodes shown above can be constructed as well.

In certain embodiments it may be advantageous to utilize such nanofabric electrodes as contacts to portions of a transistor or as part of a transistor or to contact or become part of an interconnect for subsequent sense amplifier or addressing logic circuitry, see e.g. U.S. patent application Ser. No. 10/379,973 entitled, Hybrid Circuit Having Nanotube Electromechanical Memory.

Additional electrodes can provide extra control of a switch or device constructed according to the present description. For example, FIG. 6 includes two distinct electrodes that will push and/or pull the vertical nanofabric sections in unison. The gap distances will determine whether the devices are volatile or nonvolatile for a given set of parameters.

FIG. 7 includes 3 distinct electrodes and gives extra degrees of freedom (extra redundancy, extra information storage capability, etc.) to the devices. FIG. 8 also includes 3 electrodes.

FIG. 9 includes 4 distinct electrodes, since the center electrode is divided into two electrodes (902, 904) by application of divider 906.

FIG. 10 includes two electrodes on the sides of the channel, and uses a nanofabric section coupled to top electrode 602 as a third electrode in structure 1000.

As mentioned previously, using vertically-disposed nanofabric articles permits exploitation of the smaller dimensions achievable with thin film technology than with the lithographic techniques used in horizontally-disposed nanofabric articles. For example, returning to FIG. 1A, the dimension T, or thickness of the electrode 108, across which the nanofabric is suspended is as little as a few nm thick (e.g. 10-100 nm), and is formed using thin film techniques. As technology develops in this regard, the thickness T can be less than 10 nm thick. Therefore, the scaling of the dimensions tracks with thin film technology rather than scaling with lithographic technology. It should be noted that the gap distances used with reduced length nanofabric articles may also be decreased accordingly.

Figure 11A:
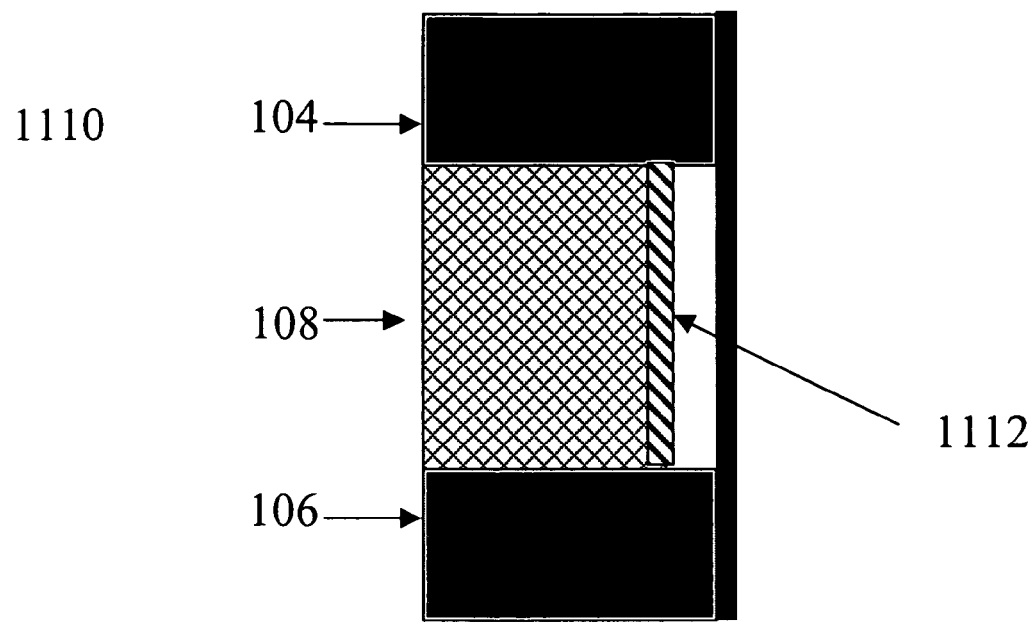
FIGS. 11A-B are cross-sectional views of an exemplary electromechanical devices.
Figure 11B:
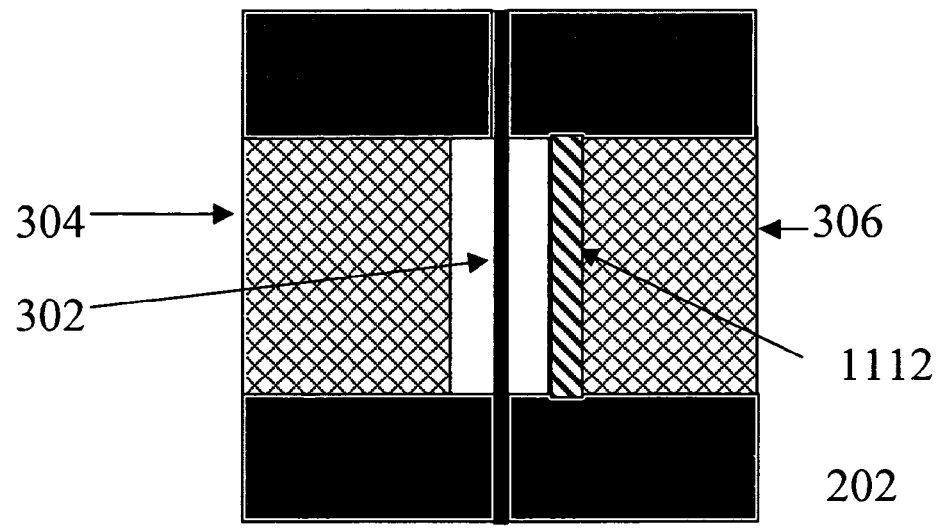

FIGS. 11A-B illustrate an embodiment of the present invention having an oxidized electrode. Structure 1110 illustrates a nanofabric based switch having an insulation layer 1112 over the exposed surface of one electrode 108. (Fabrication of such an oxidized electrode is explained in detail below. The insulation layer 1112 may be used to change the characteristics of the switch to be volatile or to provide further assurance of desired behavior. FIG. 11B illustrates a structure having opposing electrodes with a nanofabric switch disposed between them. The insulating layer, placed on the facing surface of an opposing electrode may be used to prevent different fibers from the nanofabric element from simultaneously electrically contacting both electrodes (304, 306) during a state transition. Such contact may prevent or hinder switching of the fabric between states.

Figure 12:
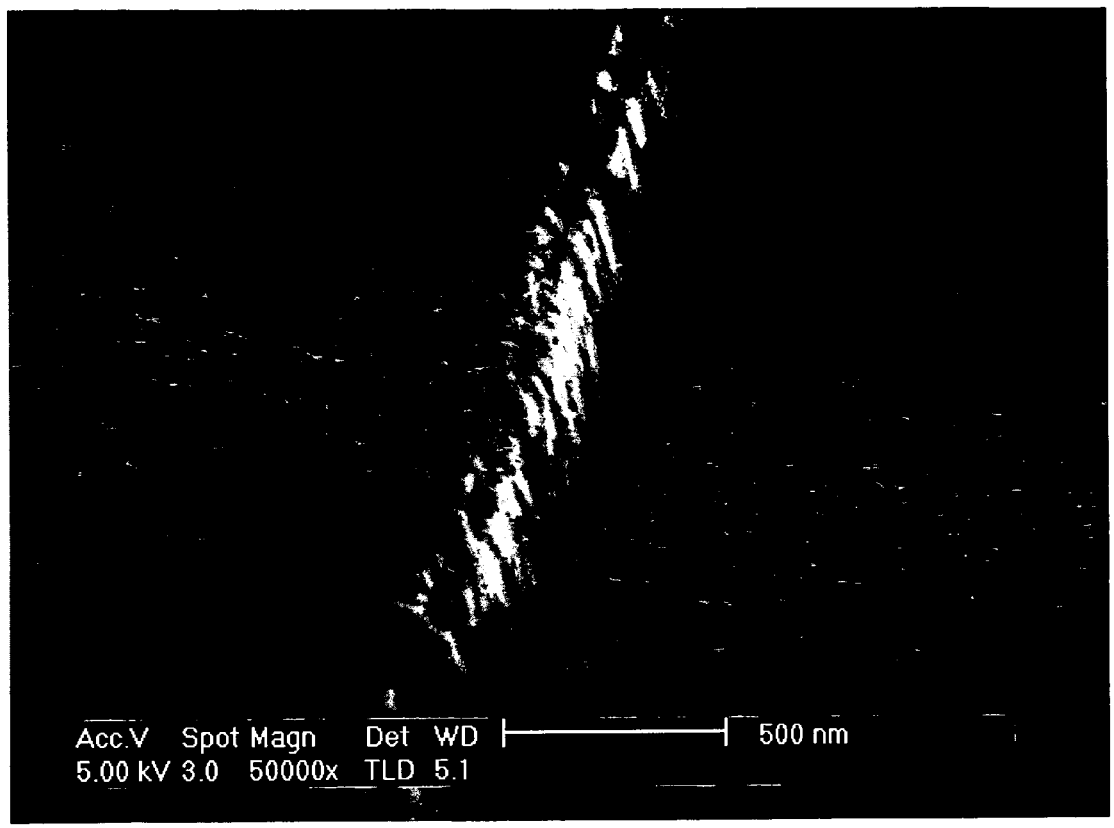
FIGS. 12 and 13 are micrographs of a nanofabric that conforms to non-planar surfaces.
Figure 13:
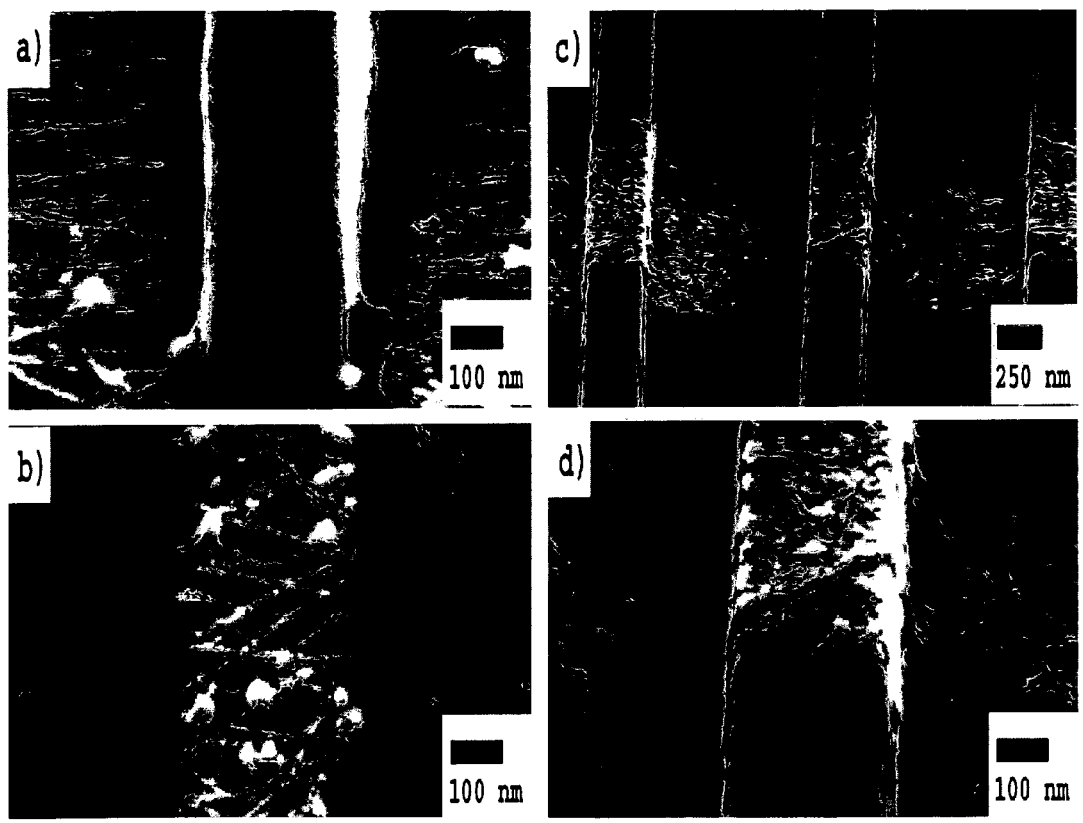

FIGS. 12 and 13 are micrographs of exemplary conformal nanofabrics. These figures illustrate how a fabric looks when formed and made to conform over vertical and horizontal surfaces.

The preferred embodiments are made using nanotube films, layers, or non-woven fabrics so that they form, or may be made to form, various useful patterned components, elements or articles. (Herein "films," "layers," or "non-woven fabrics" are referred to as "fabrics" or "nanofabrics".) The components created from the nanofabrics retain desirable physical properties of the nanotubes and/or the nanofabrics from which they are formed. In addition, preferred embodiments allow modern manufacturing techniques (e.g., those used in semiconductor manufacture) to be employed to utilize the nanofabric articles and devices.

Preferred embodiments of the present invention include articles and methods that increase a strain in the nanofabrics, allowing selectable construction of volatile and non-volatile electromechanical switches, including tri-state or tri-trace switches having both volatile and non-volatile states. The nanofabrics in some embodiments also provide for discrete cellular articles, such as memory cells, to be manufactured.

Figure 14:
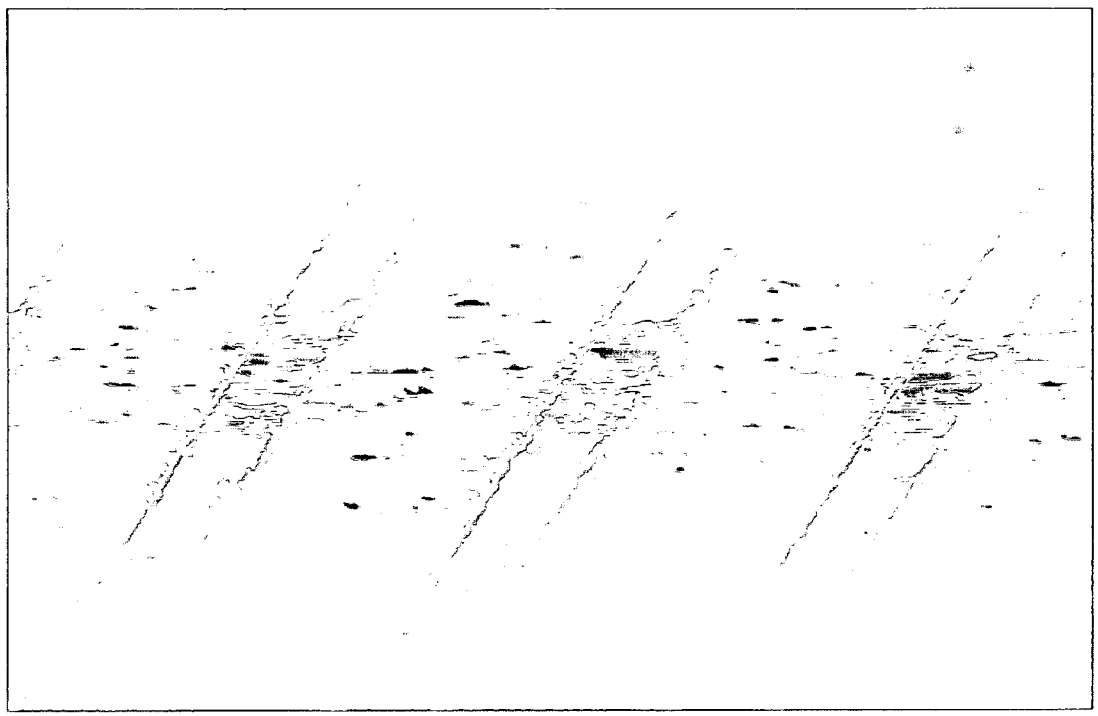
FIG. 14 is an image of an exemplary nanofabric shown in perspective.

FIG. 14 is an image of an exemplary fabric of nanotubes shown in perspective. As can be seen, the fabric may be highly porous and appear as several threads with gaps in between. In this figure there are actually several ribbons of nanofabric extending from left to right separated from one another by areas with no nanotubes. One may notice that the fabric of FIG. 13 is likewise very porous with a few nanotubes spanning the channel and contacting electrodes. In both figures, the resolution of the figure is affected by the imaging technology so some nanotubes may not appear in focus or be noticeable.

It will be further appreciated that the scope of the present invention is not limited to the above-described embodiments but rather is defined by the appended claims, and that these claims will encompass modifications and improvements to what has been described.

What is claimed is:

1. An nanotube switching device, comprising:
 a structure having a major horizontal surface and a channel formed therein,
 the channel having a vertical wall and first and second electrodes each forming a portion of the vertical wall;
 a nanotube article vertically disposed in the channel and in contact with said first and second electrodes, the nanotube article responsive to electrical stimulus to form and unform an electrically conductive pathway between said first and second electrodes.

2. The nanotube switching device of claim 1, wherein forming and unforming an electrically conductive pathway corresponds to switching between a first and a second resistance state between the first and second electrodes.

3. The nanotube switching device of claim 1, wherein the nanotube article comprises a portion of a nanotube fabric.

4. The nanotube switching device of claim 3, wherein the nanotube fabric is conformally disposed on the vertical wall of the channel.

5. The nanotube switching device of claim 1, wherein the first electrode comprises a conductive material disposed in and forming a bottom surface of the channel.

6. The nanotube switching device of claim 5, wherein the second electrode comprises a conductive material forming an upper portion of the vertical wall.

7. The nanotube switching device of claim 6, wherein the structure comprises a dielectric material and wherein the dielectric layer is interposed between the first electrode and the second electrode.

8. The nanotube switching device of claim 1, wherein the nanotube article nonvolatilely forms and unforms the electrically conductive pathway.

9. The nanotube switching device of claim 1, wherein the vertically disposed nanotube article comprises a pinned section disposed over the second electrode and pinned by an insulating layer.

10. A memory array comprising a plurality of nanotube switching devices, each device having:

a structure having a vertical wall and first and second electrodes each forming a portion of the vertical wall;

a nanotube article vertically disposed in contact with said first and second electrodes, the nanotube article responsive to electrical stimulus to form and unform an electrically conductive pathway between said first and second electrodes;

wherein at least two of the plurality of nanotube switching devices are vertically stacked.

11. The memory array of claim 10, wherein forming and unforming an electrically conductive pathway corresponds to switching between a first and a second resistance state between the first and second electrodes.

12. The memory array of claim 10, wherein the nanotube article comprises a portion of a nanotube fabric.

13. The memory array of claim 12, wherein the nanotube fabric is conformally disposed on the vertical wall of the structure.

14. The memory array of claim 10, wherein the nanotube article volatilely forms and unforms the electrically conductive pathway.

15. The memory array of claim 10, wherein the nanotube article nonvolatilely forms and unforms the electrically conductive pathway.

16. The memory array of claim 15, further comprising sensing circuitry in electrical communication with the first and second electrodes of each nanotube switching device for sensing a resistance state between the first and second electrodes, wherein the resistance state is substantially undisturbed by the sensing circuitry sensing the resistance state.

17. The memory array of claim 10, wherein for at least two vertically stacked nanotube switching devices, the first nanotube switching device and the second nanotube switching device share one of the first and second electrodes.

18. The memory array of claim 10, wherein for each nanotube switching device, the first electrode comprises a layer of conductive material having a surface forming a bottom portion of the vertical wall.

19. The memory array of claim 18, wherein the second electrode comprises a layer of conductive material having a surface forming an upper portion of the vertical wall.

20. The memory array of claim 19, wherein the structure comprises a dielectric material and wherein the dielectric layer is interposed between the first electrode and the second electrode.

21. The memory array of claim 20, wherein the nanotube article is printed over an upper surface of the second electrode, the vertical wall, and an upper surface of the first electrode.

22. The memory array of claim 20, wherein the nanotube article is conformally disposed over a surface of the dielectric layer, and wherein the portion of the nanotube article in contact with the dielectric layer switches between a first and a second resistance state to form and unform the electrically conductive pathway.

23. A nanotube switching device comprising:

a substrate having a major surface defining a horizontal orientation;

a nanotube article having a plurality of nanotubes, wherein the article is oriented substantially vertically, wherein the article is in electrical contact with a first and second electrode at either end of said article, and wherein said article is switchable between two informational states.

24. The nanotube switching device of claim 23, wherein the first electrode comprises a bottom electrode disposed on the substrate and wherein the second electrode comprises a top electrode disposed over an upper surface of the nanotube article.

25. The nanotube switching device of claim 23, wherein the nanotube article comprises a plurality of non-woven nanotubes, providing a plurality of electrically conductive pathways between the first and second electrodes.

\* \* \* \* \*